United States Patent
Wu et al.

(10) Patent No.: US 11,257,953 B2
(45) Date of Patent: Feb. 22, 2022

(54) SELECTIVE GROWTH FOR HIGH-ASPECT RATIO METAL FILL

(71) Applicant: Taiwan Semiconductor Manufacturing Company, Ltd., Hsin-Chu (TW)

(72) Inventors: Chih-Nan Wu, Hsin-Chu (TW); Shiu-Ko JangJian, Hsin-Chu (TW); Chun Che Lin, Hsin-Chu (TW); Wen-Cheng Hsuku, Hsin-Chu (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 1 day.

(21) Appl. No.: 16/668,871

(22) Filed: Oct. 30, 2019

(65) Prior Publication Data
US 2020/0066911 A1 Feb. 27, 2020

Related U.S. Application Data

(60) Division of application No. 16/166,412, filed on Oct. 22, 2018, now Pat. No. 10,797,176, which is a (Continued)

(51) Int. Cl.
*H01L 29/78* (2006.01)
*H01L 21/28* (2006.01)
(Continued)

(52) U.S. Cl.
CPC .... *H01L 29/7851* (2013.01); *H01L 21/28088* (2013.01); *H01L 21/28556* (2013.01); *H01L 21/3212* (2013.01); *H01L 21/3213* (2013.01); *H01L 21/7684* (2013.01); *H01L 21/76802* (2013.01); *H01L 21/76831* (2013.01); *H01L 21/76843* (2013.01); *H01L 21/76844* (2013.01); *H01L 21/76877* (2013.01); *H01L 21/76879* (2013.01); *H01L 23/485* (2013.01);
(Continued)

(58) Field of Classification Search
CPC ............... H01L 29/66621; H01L 29/66545
See application file for complete search history.

(56) References Cited

U.S. PATENT DOCUMENTS 6,069,047 A  5/2000  Wanlass
7,667,271 B2  2/2010  Yu et al.
(Continued)

FOREIGN PATENT DOCUMENTS

CN        101950756      1/2011

*Primary Examiner* — Trang Q Tran
(74) *Attorney, Agent, or Firm* — Haynes and Boone, LLP

(57) ABSTRACT

An improved conductive feature for a semiconductor device and a technique for forming the feature are provided. In an exemplary embodiment, the semiconductor device includes a substrate having a gate structure formed thereupon. The gate structure includes a gate dielectric layer disposed on the substrate, a growth control material disposed on a side surface of the gate structure, and a gate electrode fill material disposed on the growth control material. The gate electrode fill material is also disposed on a bottom surface of the gate structure that is free of the growth control material. In some such embodiments, the gate electrode fill material contacts a first surface and a second surface that are different in composition.

20 Claims, 26 Drawing Sheets

Related U.S. Application Data continuation of application No. 15/290,509, filed on Oct. 11, 2016, now Pat. No. 10,109,741, which is a division of application No. 14/588,223, filed on Dec. 31, 2014, now Pat. No. 9,466,494.

(60) Provisional application No. 62/081,357, filed on Nov. 18, 2014.

(51) Int. Cl.
| | | |
|---|---|---|
| *H01L 21/285* | (2006.01) | |
| *H01L 29/66* | (2006.01) | |
| *H01L 21/3213* | (2006.01) | |
| *H01L 29/49* | (2006.01) | |
| *H01L 29/423* | (2006.01) | |
| *H01L 23/485* | (2006.01) | |
| *H01L 21/768* | (2006.01) | |
| *H01L 29/51* | (2006.01) | |
| *H01L 29/417* | (2006.01) | |
| *H01L 21/321* | (2006.01) | |
| *H01L 23/532* | (2006.01) | |

(52) U.S. Cl.
CPC .. *H01L 29/41791* (2013.01); *H01L 29/42372* (2013.01); *H01L 29/4966* (2013.01); *H01L 29/517* (2013.01); *H01L 29/66545* (2013.01); *H01L 29/66795* (2013.01); *H01L 29/78* (2013.01); *H01L 29/785* (2013.01); *H01L 23/53223* (2013.01); *H01L 23/53266* (2013.01); *H01L 29/513* (2013.01)

(56) References Cited

U.S. PATENT DOCUMENTS

| | | |
|---|---|---|
| 7,910,453 B2 | 3/2011 | Xu et al. |
| 8,377,779 B1 | 2/2013 | Wang |
| 8,399,931 B2 | 3/2013 | Liaw et al. |
| 8,546,227 B2 | 10/2013 | Chuang et al. |
| 8,652,894 B2 | 2/2014 | Lin et al. |
| 8,686,516 B2 | 4/2014 | Chen et al. |
| 8,716,765 B2 | 5/2014 | Wu et al. |
| 8,723,272 B2 | 5/2014 | Liu et al. |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,012,319 B1 * | 4/2015 | Choi .................. H01L 21/28158 438/591 |
| 9,368,603 B2 | 6/2016 | Chuang et al. |
| 2006/0051931 A1 | 3/2006 | Wellhausen |
| 2012/0319214 A1 * | 12/2012 | Ma .................. H01L 21/823842 257/410 |
| 2013/0299914 A1 * | 11/2013 | Kim ...................... H01L 27/092 257/369 |
| 2014/0001574 A1 | 1/2014 | Chen et al. |
| 2014/0110755 A1 | 4/2014 | Colinge |
| 2014/0151812 A1 | 6/2014 | Liaw |
| 2014/0273397 A1 | 9/2014 | Rodder et al. |
| 2015/0035073 A1 | 2/2015 | Ando et al. |
| 2016/0020297 A1 * | 1/2016 | Kuang .............. H01L 29/66795 257/410 |
| 2016/0141179 A1 | 5/2016 | Wu et al. |
| 2017/0033222 A1 | 2/2017 | Wu et al. |
| 2019/0058063 A1 | 2/2019 | Wu et al. |

\* cited by examiner

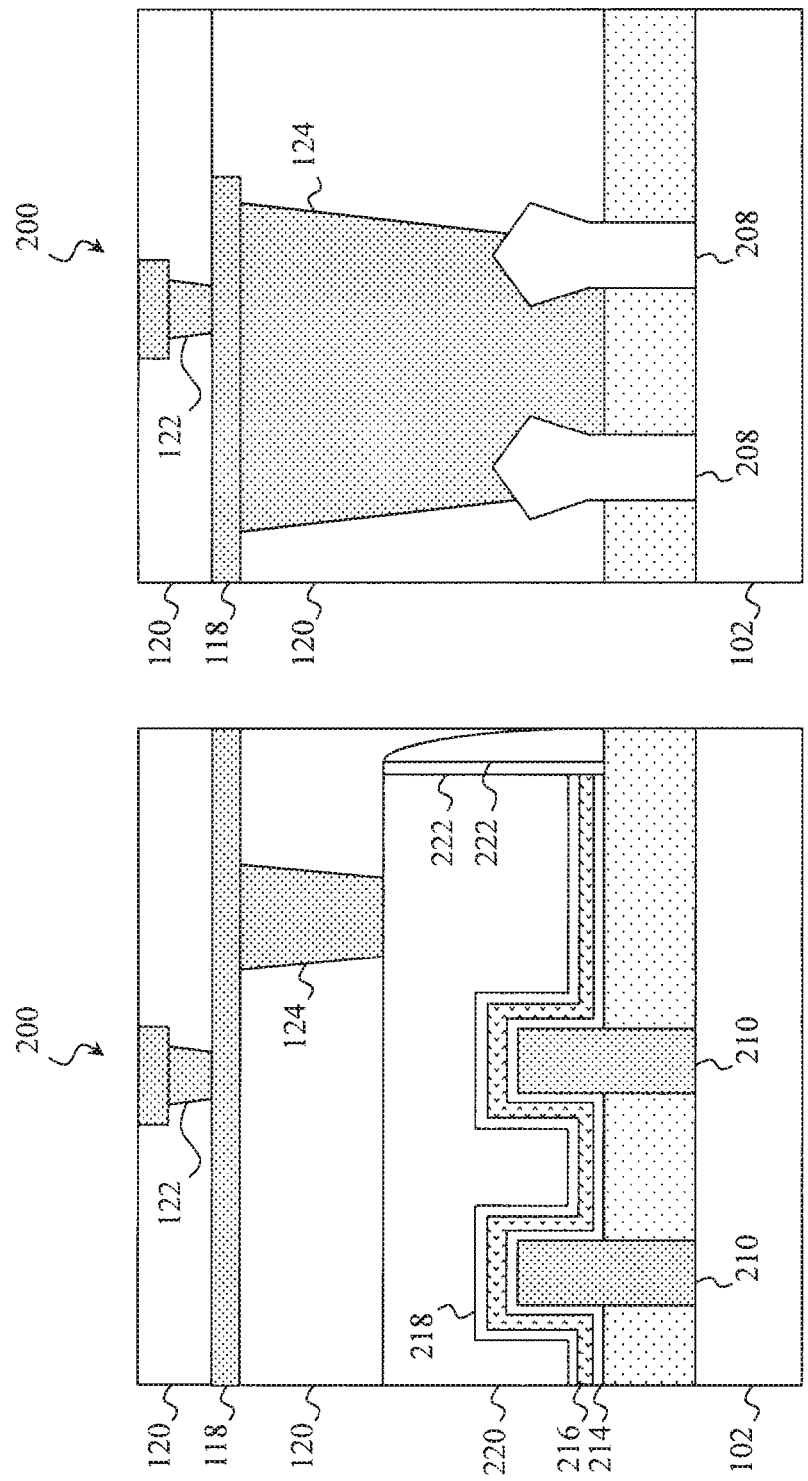

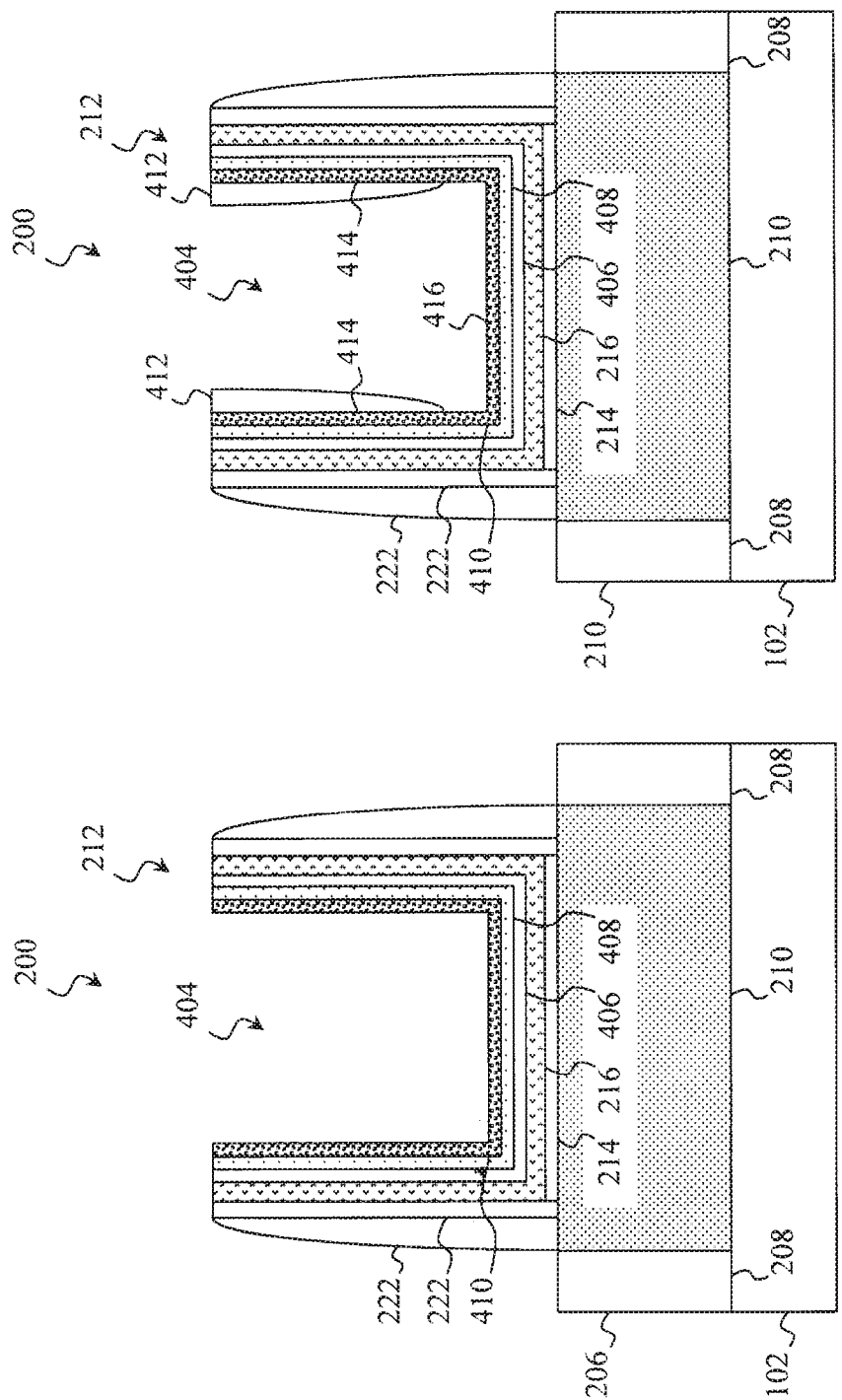

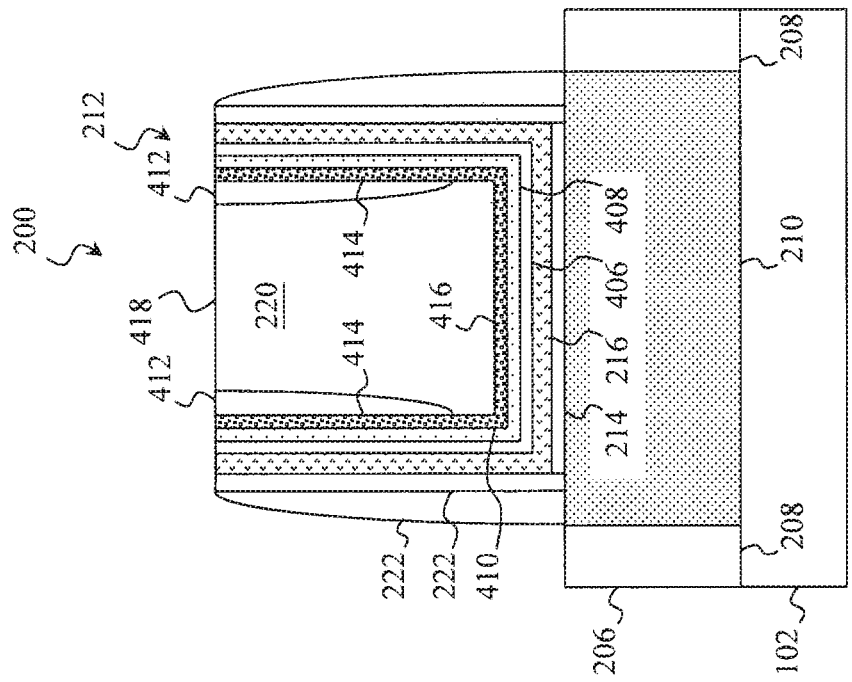
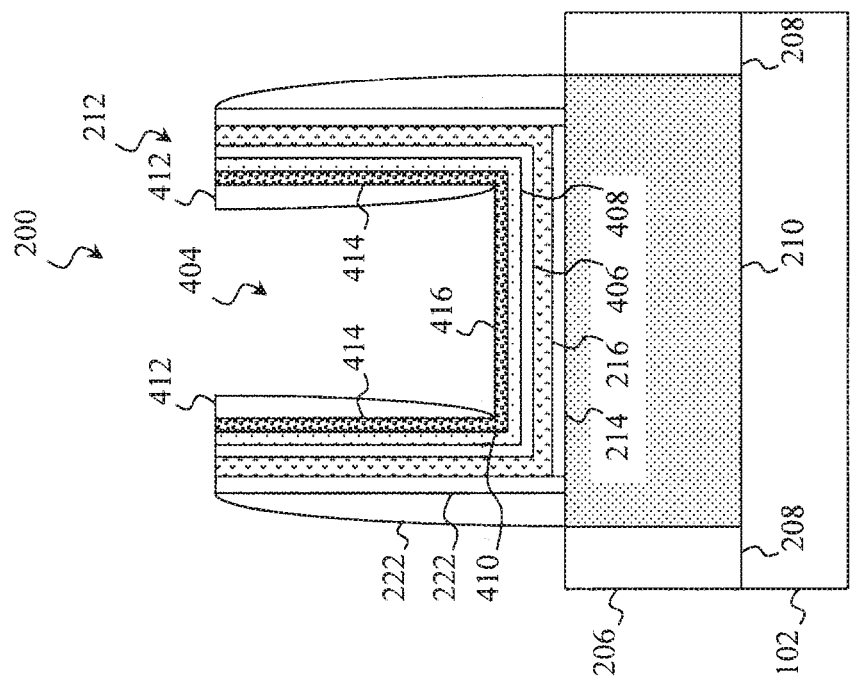

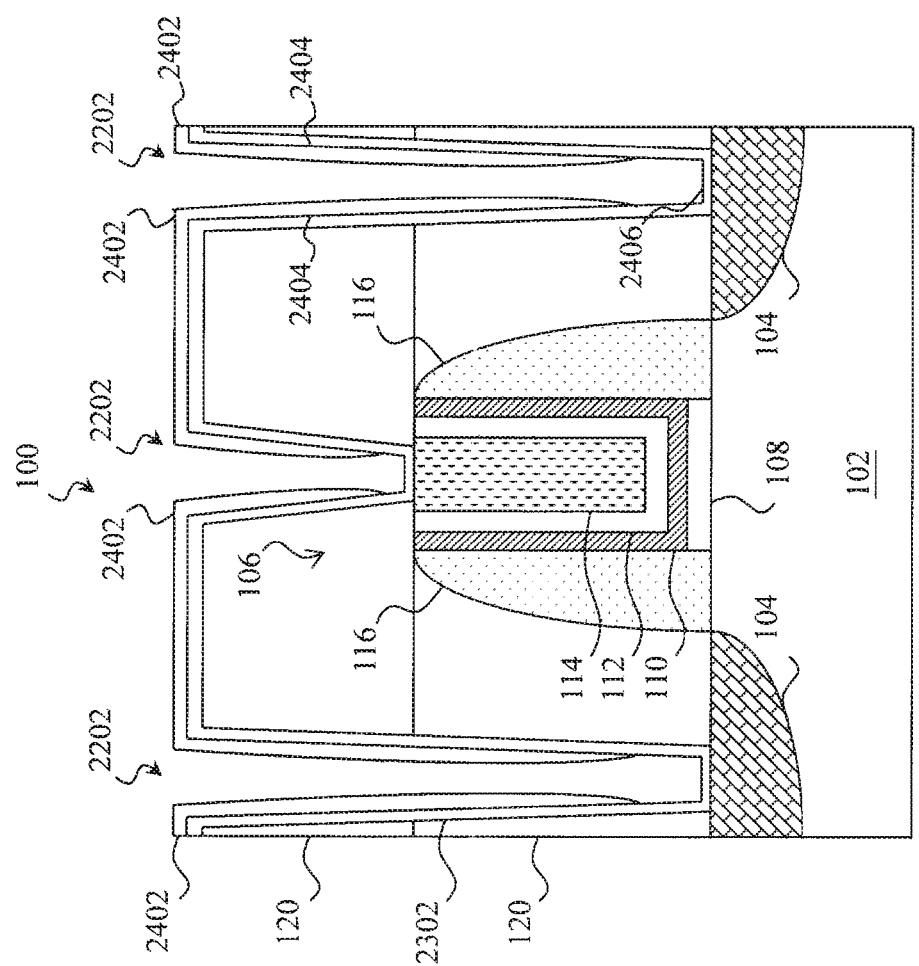

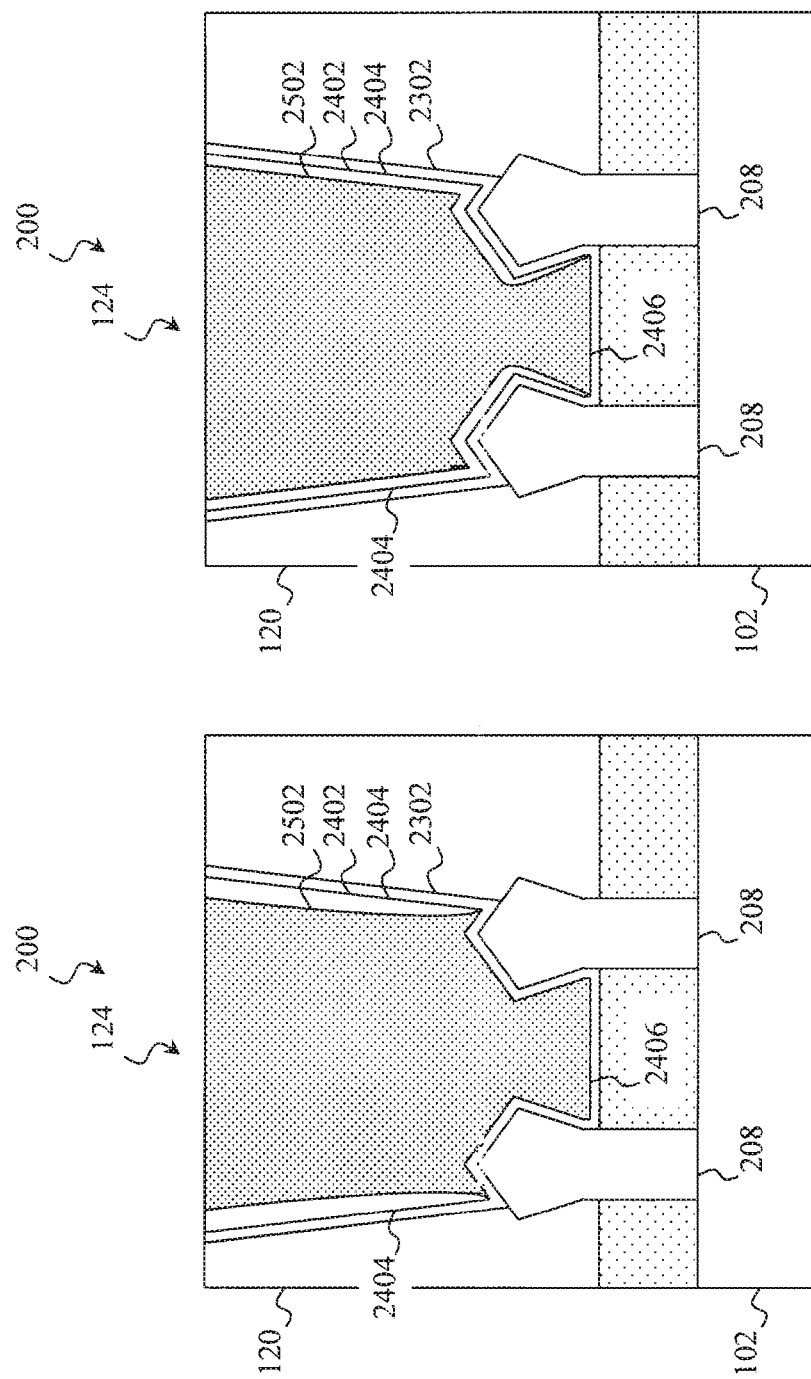

SELECTIVE GROWTH FOR HIGH-ASPECT RATIO METAL FILL

PRIORITY

The present application is a divisional application of U.S. application Ser. No. 16/166,412, filed on Oct. 22, 2018, which is a continuation application of U.S. application Ser. No. 15/290,509, filed on Oct. 11, 2016, which is a divisional application of U.S. application Ser. No. 14/588,223, filed on Dec. 31, 2014, which claims the benefit of U.S. Provisional Application Ser. No. 62/081,357, filed on Nov. 18, 2014, entitled "SELECTIVE GROWTH FOR HIGH-ASPECT RATIO METAL FILL," each of which is incorporated herein by reference in its entirety.

BACKGROUND

The semiconductor industry has progressed into nanometer technology process nodes in pursuit of higher device density, higher performance, and lower cost. Despite groundbreaking advances in materials and fabrication, scaling planar device such as the conventional MOSFET has proven challenging. As merely some examples, deposition techniques, etching techniques, and other processes that circulate liquids, gasses, or plasmas across device features perform well when the features are widely spaced and accessible to the ambient reactants. However, narrow high-aspect ratio trenches and cavities restrict circulation and reduce the amount of reactants available within the trench. This may cause uneven deposition or etching within the trench.

To further push the state of the art, circuit designers are looking to novel structures to deliver improved performance. One avenue of inquiry is the development of three-dimensional designs, such as a fin-like field effect transistor (FinFET). A FinFET can be thought of as a typical planar device extruded out of a substrate and into the gate. A typical FinFET is fabricated with a thin "fin" (or fin structure) extending up from a substrate. The channel of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

However, FinFETs and other nonplanar devices have even more complicated geometries and may have more high-aspect ratio trenches to fill. Accordingly, while conventional techniques for device fabrication have been adequate in some respects, they have been less than satisfactory in others. In order to continue to meet ever-increasing design requirements, further advances are needed in device fabrication and other areas. The present disclosure provides improvements that relate to the fabrication of planar devices as well as FinFETs and other nonplanar devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. Also, several elements and features are shown in the figures, not all of which are numbered for the sake of clarity. It is understood, however, that symmetrical features and items will be similarly situated.

FIG. 2B is a cross-sectional view of the nonplanar semiconductor device, where the cross-section is taken through a channel region, according to embodiments of the present disclosure.

FIG. 2C is a cross-sectional view of the nonplanar semiconductor device, where the cross-section is taken through a source/drain region, according to embodiments of the present disclosure.

FIGS. 4-11 are cross-sectional views of a portion of a nonplanar device undergoing the method of forming a gate electrode according to embodiments of the present disclosure.

FIGS. 27A and 27B are cross-sectional views of a source/drain region of a nonplanar device undergoing the method of forming a contact according to embodiments of the present disclosure.

DETAILED DESCRIPTION

Figure 1:
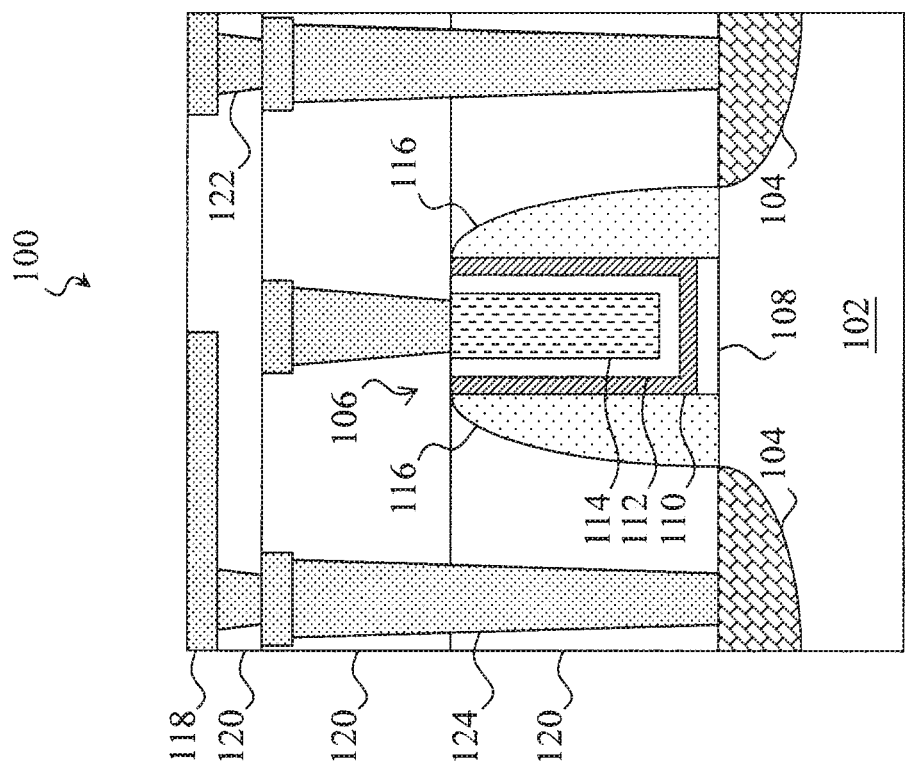
FIG. 1 is a cross-sectional view of a semiconductor device according to embodiments of the present disclosure.

The present disclosure relates generally to IC device manufacturing and, more particularly, to forming conductive features including device gates, contacts, and vias.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

A process is described for forming conductive features that offers improved gap filling in high-aspect ratio trenches. The technique reduces and even eliminates necking, voids, and discontinuities that may occur with other deposition techniques and is useful in forming device gates, contacts, vias, and other structures. For context, FIG. 1 and FIGS. 2A-2C illustrate planar and nonplanar semiconductor devices and some of the features thereof that may be formed by the process of the present disclosure. Of course, these features are merely exemplary, and the technique may be used to form any suitable feature in any type of device.

Referring first to FIG. 1, illustrated is a cross-sectional view of a semiconductor device 100 according to embodiments of the present disclosure. FIG. 1 has been simplified for the sake of clarity and to better illustrate the concepts of the present disclosure. The semiconductor device 100 is a typical of a planar MOSFET and is exemplary of both N-type metal-oxide-semiconductor transistor devices (referred to as NMOS devices) and P-type metal-oxide-semiconductor transistor devices (referred to as PMOS devices). The device 100 is formed on a substrate 102 such as a bulk silicon substrate. Alternatively, the substrate 102 may comprise an elementary (single element) semiconductor, such as silicon or germanium in a crystalline structure; a compound semiconductor, such as silicon germanium, silicon carbide, gallium arsenic, gallium phosphide, indium phosphide, indium arsenide, and/or indium antimonide; and/or combinations thereof. Possible substrates 102 also include a silicon-on-insulator (SOI) substrate. SOI substrates are fabricated using separation by implantation of oxygen (SIMOX), wafer bonding, and/or other suitable methods. In other examples, the substrate 102 may include a multilayer semiconductor structure.

The substrate 102 may include various doped regions (e.g., p-type wells or n-type wells), such as the illustrated source/drain regions 104. The doped regions may be doped with p-type dopants, such as phosphorus or arsenic, and/or n-type dopants, such as boron or $BF_2$ depending on design requirements. The doped regions may be formed directly on the substrate, in a P-well structure, in an N-well structure, in a dual-well structure, or using a raised structure. Doped regions may be formed by implantation of dopant atoms, in-situ doped epitaxial growth, and/or other suitable techniques. In some embodiments, the doped regions include halo/pocket regions that can reduce short channel effects (e.g., punch-through effects) and may be formed by tilt-angle ion implantation or other suitable technique.

The semiconductor device 100 may include a gate structure 106 disposed on the substrate between the source/drain regions 104. The flow of carriers (electrons for an n-channel device and holes for a p-channel device) through a channel region between the source/drain regions 104 is controlled by a voltage applied to the gate structure 106. Suitable gate structures 106 include both polysilicon and metal gates. In an embodiment utilizing a gate first process, the gate structure 106 is a functional gate. Conversely, in an embodiment utilizing a gate last process, the gate structure 106 may be a functional gate or a sacrificial (dummy) gate. In the exemplary gate last process, a portion of a sacrificial gate structure is removed and replaced with a functional gate material, such as a metal, to form a functional gate structure 106. The gate structure 106 may include multiple layers, and in the illustrated embodiment, the gate structure 106 includes an interfacial layer (IL) 108, a dielectric layer 110, a capping layer 112, and a gate electrode 114. In some embodiments, sidewall spacers 116 are formed on one or more lateral surfaces of the gate structure.

To describe these features in more detail, the interfacial layer 108 is disposed on the substrate 102 and may include an interfacial material such as a silicon oxide, silicon nitride, silicon oxynitride, other semiconductor oxides, other suitable interfacial materials, and/or combinations thereof. The interfacial layer 108 may be formed to any suitable thickness using any suitable process including thermal growth, atomic layer deposition (ALD), chemical vapor deposition (CVD), high-density plasma CVD (HDP-CVD), physical vapor deposition (PVD), spin-on deposition, and/or other suitable deposition processes.

The gate dielectric layer 110 is disposed on the interfacial layer 108 and may comprise one or more dielectric materials, which are commonly characterized by their dielectric constant relative to silicon dioxide. Thus, the gate dielectric layer 110 may include a high-k dielectric material such as $HfO_2$, HfSiO, HfSiON, HfTaO, HfTiO, HfZrO, zirconium oxide, aluminum oxide, hafnium dioxide-alumina ($HfO_2$-$Al_2O_3$) alloy, other suitable high-k dielectric materials, and/or combinations thereof. Additionally or in the alternative, the gate dielectric layer 110 may include other dielectrics such as silicon oxide, silicon nitride, silicon oxynitride, silicon carbide, amorphous carbon, tetraethylorthosilicate (TEOS), other suitable dielectric material, and/or combinations thereof. The gate dielectric layer 110 may be formed to any suitable thickness using any suitable process including ALD, CVD, HDP-CVD, PVD, spin-on deposition, and/or other suitable deposition processes.

The exemplary gate structure 106 may include a capping layer 112 disposed on the gate dielectric layer 110. The capping layer 112 may comprise silicon oxide, silicon nitride, silicon oxynitride, other semiconductor oxides, other semiconductor nitrides, other suitable materials, and/or combinations thereof.

A gate electrode 114 is disposed over the gate dielectric layer 110 and the capping layer 112, if present. Despite naming conventions such as MOSFET, the semiconductor device 100 includes embodiments with polysilicon-containing gate electrodes 114 as well as metal-containing electrodes 114. The gate electrode 114 may have a multilayer structure that includes one or more of an adhesion layer, a wetting layer, a liner layer, and a metal fill layer. Accordingly, the gate electrode 114 may include any suitable material, such as polysilicon, aluminum, copper, titanium, tantalum, tungsten, molybdenum, tantalum nitride, nickel silicide, cobalt silicide, TiN, WN, TiAl, TiAlN, TaCN, TaC, TaSiN, metal alloys, other suitable materials, and/or combinations thereof.

In some embodiments utilizing a gate last process, the gate electrode 114 contains a sacrificial (dummy) portion that includes polysilicon, a dielectric, a masking material, and/or other suitable materials. In such embodiments, the sacrificial portion may be removed in whole in or part by a suitable wet and/or dry etching process and replaced by another gate electrode such as a metal-containing gate electrode 114. As described in more detail below, the deposition technique of the present disclosure is suitable for use in forming a metal gate in a recess left by removing a sacrificial gate portion even where the high aspect ratio (ratio of depth to width) of the recess may pose difficulties for conventional deposition processes.

In some embodiments, gate spacers 116 or sidewall spacers are formed on each side of the gate structure 106 (on the sidewalls of the gate structure 106). The gate spacers 116 may be used to align the source/drain regions 104 and may provide a rigid surface to prevent trench collapse during a gate replacement process. The gate spacers 116 may include any suitable dielectric material, such as a semiconductor oxide, a semiconductor nitride, a semiconductor carbide, a semiconductor oxynitride, other suitable materials, and/or combinations thereof.

To integrate the semiconductor device 100 into a circuit, an interconnect structure may be formed on the device 100. In the illustrated embodiment, the interconnect structure includes a number of conductive traces 118 interspersed between layers of an inter-level dielectric (ILD) 120. The ILD 120 may comprise any suitable dielectric material, such as a semiconductor oxide, a semiconductor nitride, a semiconductor oxynitride, a semiconductor carbide, TEOS oxide, phosphosilicate glass (PSG), borophosphosilicate glass (BPSG), fluorinated silica glass (FSG), carbon doped silicon oxide, Black Diamond®, Xerogel, Aerogel, amorphous fluorinated carbon, Parylene, BCB (bis-benzocyclobutenes), SiLK (Dow Chemical, Midland, Michigan), polyimide, other suitable materials, and/or combinations thereof. The ILD 120 layers act as an insulator that supports and isolates the conductive traces 118. Vias 122 extend through the ILD 120 layers to connect conductive traces 118 at different horizontal locations, and contacts 124 extend through the ILD 120 layers to connect to source/drain regions 104, gate structures 106, and other features at or near the substrate 102. As will be shown, the technique of the present disclosure is suitable for forming contacts 124 and vias 122. Of course, the contacts 124, vias 122, and the aforementioned gate electrode 114 are merely some examples of device features that may be formed by this technique.

Figure 2A:
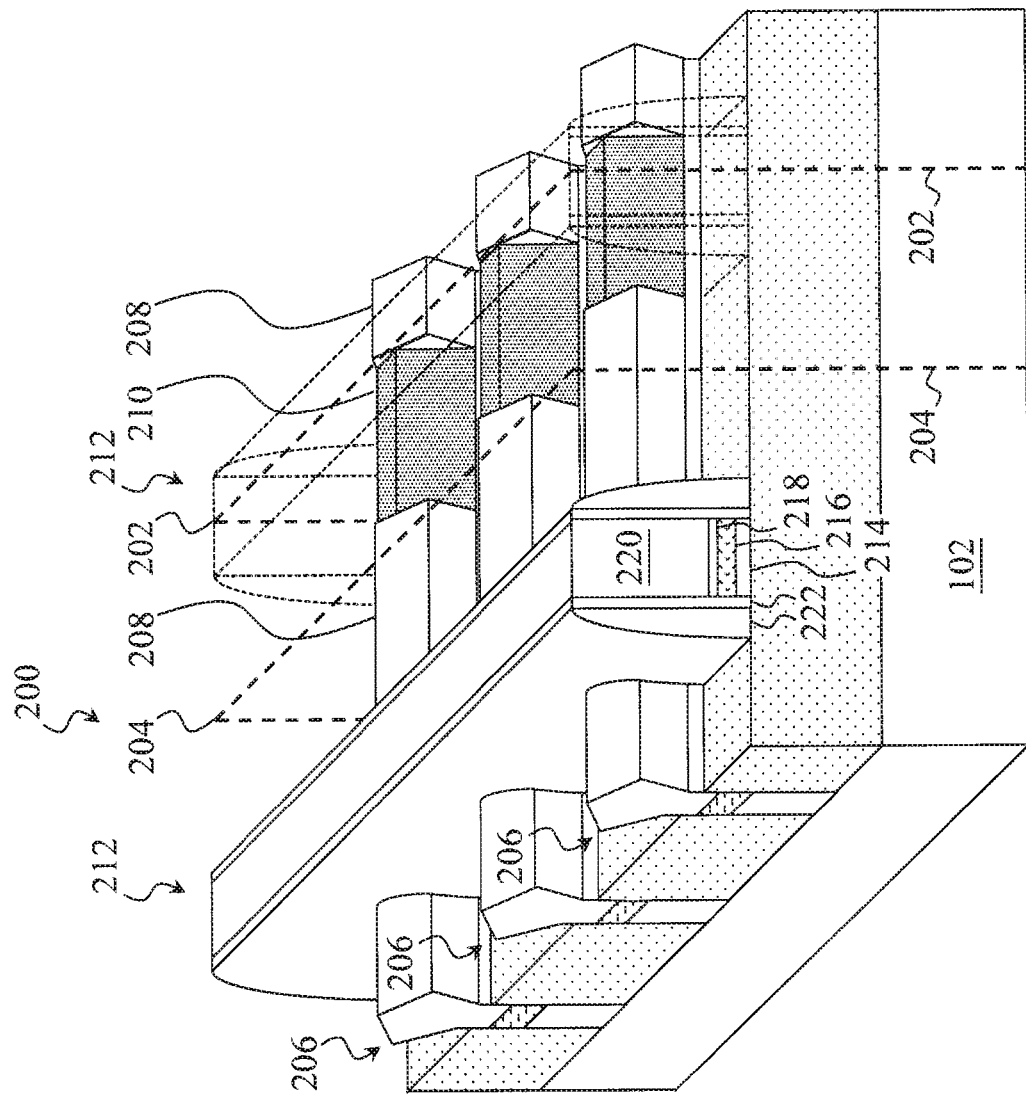
FIG. 2A is a perspective view of a nonplanar semiconductor device according to embodiments of the present disclosure.

Whereas FIG. 1 highlights exemplary features of planar devices that may be formed by the present technique, FIGS. 2A-2C, illustrate exemplary features of a nonplanar device that may be formed by the present technique. FIG. 2A is a perspective view of a nonplanar semiconductor device 200 according to embodiments of the present disclosure. FIG. 2B is a cross-sectional view of a portion of the semiconductor device 200, where the cross-section is taken through a channel region (along plane 202), according to embodiments of the present disclosure. FIG. 2C is a cross-sectional view of a portion of the semiconductor device 200, where the cross-section is taken through a source/drain region (along plane 204), according to embodiments of the present disclosure. FIGS. 2A-2C have been simplified for the sake of clarity and to better illustrate the concepts of the present disclosure.

Referring to FIGS. 2A-2C, the semiconductor device 200 includes a substrate 102 or wafer with one or more fin structures 206 formed upon it. The fin structures 206 are representative of any raised feature, and while the illustrated embodiments include FinFET fin structures 206, further embodiments include other raised active and passive devices formed upon the substrate 102. The illustrated fin structures 206 each comprise a pair of opposing source/drain regions 208, which may include various doped semiconductor materials, and a channel region 210 disposed between the source/drain regions 208. The flow of carriers through the channel region 210 is controlled by a voltage applied to a gate structure 212 adjacent to and overwrapping the channel region 210. One of the gate structures 212 is shown as translucent to better illustrate the underlying channel region 210. In the illustrated embodiment, the channel region 210 rises above the plane of the substrate 102 upon which it is formed, and accordingly, the fin structure 206 may be referred to as a "nonplanar" device. The raised channel region 210 provides a larger surface area proximate to the gate structure 212 than in comparable planar devices. This strengthens the electromagnetic field interactions between the gate structure 212 and the channel region 210, which may reduce leakage and short channel effects associated with smaller devices. Thus in many embodiments, FinFETs and other nonplanar devices deliver better performance in a smaller footprint than their planar counterparts.

The elements of the semiconductor device 200 will now be described in additional detail. Substrate 102 may be substantially similar to the substrate 102 of FIG. 1 and may include any suitable semiconductor and/or non-semiconductor material. For example, the substrate 102 may include one or more layers of an elementary semiconductor, such as silicon or germanium; a compound semiconductor, such as silicon germanium, silicon carbide, gallium arsenic, gallium phosphide, indium phosphide, indium arsenide, and/or indium antimonide; a non-semiconductor material, such as soda-lime glass, fused silica, fused quartz, calcium fluoride ($CaF_2$); other suitable materials; and/or combinations thereof.

The fin structures 206 are formed on the substrate 102 by recessing surrounding portions of the substrate 102 and leaving the fin structures 206 and/or by depositing material to grow the fin structures 206 on the substrate 102. After a gate structure 212 is formed to protect the channel regions 210 of the fin structures, additional semiconductor material may be added to the source/drain regions 208 of the fin structure 206. In many embodiments, the additional material is deposited by one or more epitaxy or epitaxial (epi) processes, whereby Si features, SiGe features, and/or other suitable features are grown in a crystalline state on the fin structure 206. Suitable epitaxy processes include CVD deposition techniques (e.g., vapor-phase epitaxy (VPE) and/or ultra-high vacuum CVD (UHV-CVD)), molecular beam epitaxy, and/or other suitable processes. The material of the source/drain regions 208 may be in-situ doped during the epitaxy process by introducing doping species including: p-type dopants, such as boron or $BF_2$; n-type dopants, such as phosphorus or arsenic; and/or other suitable dopants including combinations thereof. If the source/drain regions 208 are not in-situ doped, an implantation process (i.e., a junction implant process) is performed to dope the regions 208.

The gate structure 212 is formed on top of one or more of the fin structures 206 and may include an interfacial layer 214, a gate dielectric layer 216, a capping layer 218, and a gate electrode 220 disposed on and overwrapping the channel region 210 of the fin structures 206. Each of these elements may be substantially similar to their planar device counterparts in composition. For example, the interfacial layer 214 may include an oxide, HfSiO, a nitride, an oxynitride, and/or other suitable material and may be deposited by any suitable method, such as thermal oxidation, ALD, CVD, ozone oxidation, etc. The gate dielectric layer 216 may include any suitable dielectric such as a high-k dielectric material including: LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), and/or other suitable materials. The capping layer 218 may comprise silicon oxide, silicon nitride, silicon oxynitride, other semiconductor oxides, other semiconductor nitrides, other suitable materials, and/or combinations thereof.

The gate electrode 220 is disposed on the gate dielectric layer 216 and on the capping layer 218, if present, and in various examples, contains polysilicon, metals, metal alloys, metal compounds, and/or non-metallic conductors. Suitable metals include W, Al, Cu, Ti, Ag, TiAlN, TaC, TaCN, TaSiN, Mn, Zr, TiN, TaN, Ru, Mo, WN, and/or any other suitable materials. In some embodiments, different gate materials are used for nMOS and pMOS devices. The gate electrode 220 may have a multilayer structure that includes one or more of an adhesion layer, a wetting layer, a liner layer, and a metal fill layer. As with the planar device, the technique of the present disclosure may be used to form the gate electrode 220 as part of a gate replacement process or other gate-forming technique.

The gate structure 212 may also include one or more sidewall spacing layers 222, of which two are shown. Suitable materials for the sidewall spacing layers 222 include dielectrics such as semiconductor oxides, semiconductor nitrides, semiconductor oxynitrides, semiconductor carbides, and/or other dielectrics. In some examples, the sidewall spacing layers 2220 include alternating layers of different dielectrics such as a first semiconductor oxide spacing layer and a second semiconductor nitride spacing layer. Any of a number of techniques may be used to form the sidewall spacing layers 222 including CVD, PVD, ALD, and/or other suitable deposition techniques.

Similar to the exemplary planar device, an interconnect structure is disposed on the substrate 102 and on the gate structure 212 that includes a number of conductive traces 118 interspersed between layers of an inter-level dielectric (ILD) 120. For clarity, the interconnect structure is not illustrated in FIG. 2A to avoid obscuring other features. As in the planar example of FIG. 1, the technique of the present disclosure is suitable for forming contacts 124 and vias 122 within the interconnect structure of nonplanar device 200.

Figure 3:
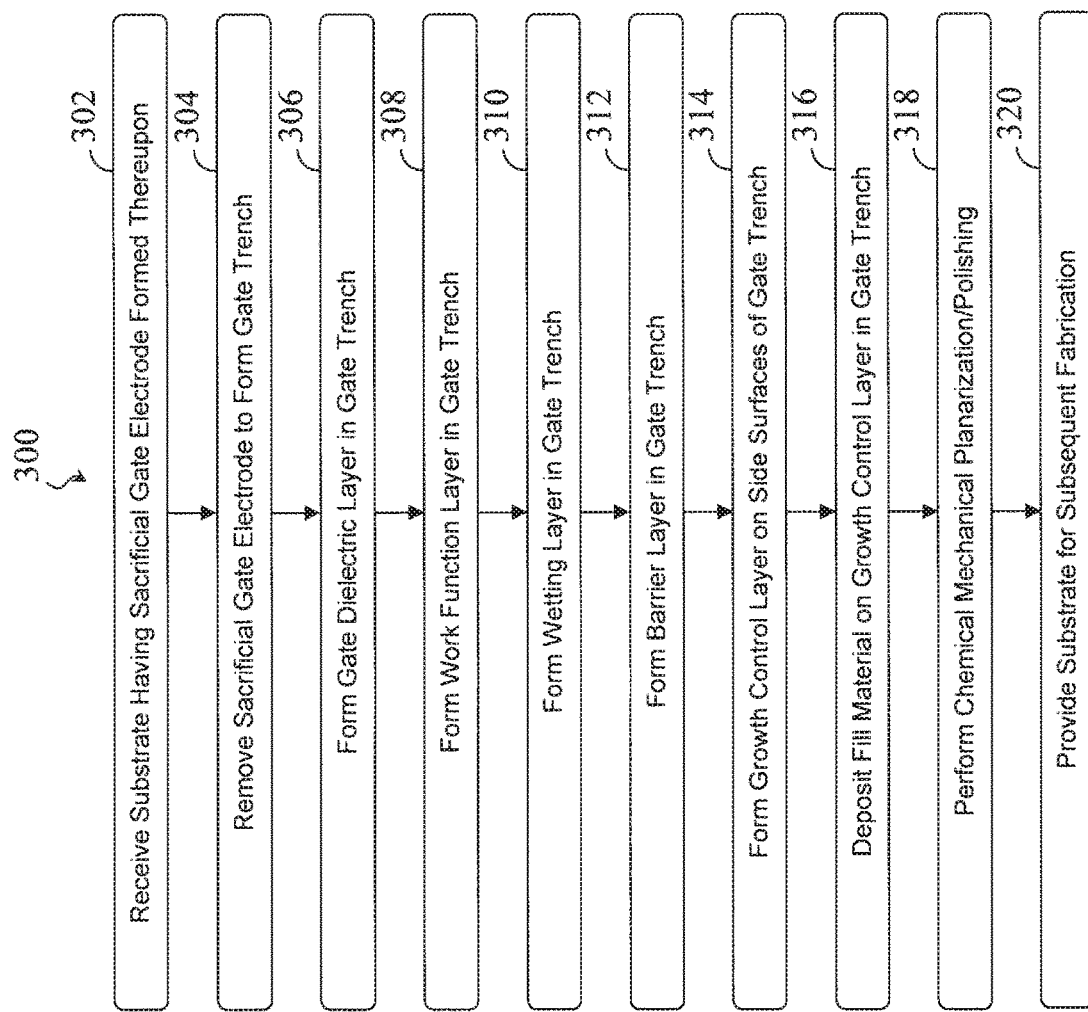
FIG. 3 is a flow diagram of a method for forming a gate electrode according to embodiments of the present disclosure.
Figure 5:
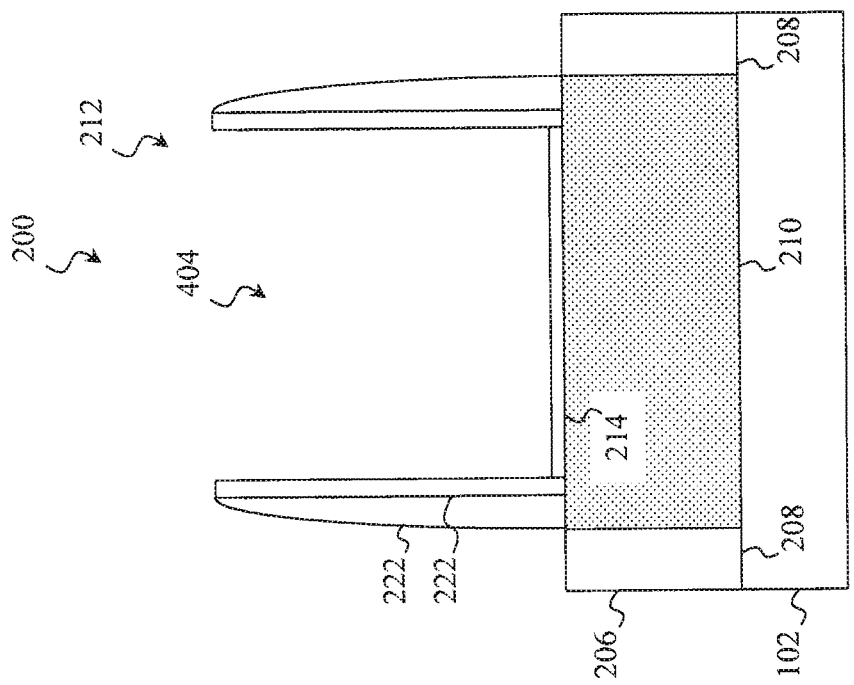

An application using the present technique to form a gate electrode is described with reference to FIGS. 3-11. FIG. 3 is a flow diagram of the method 300 for forming a gate electrode according to embodiments of the present disclosure. It is understood that additional steps can be provided before, during, and after the method 300 and that some of the steps described can be replaced or eliminated for other embodiments of the method 300. FIGS. 4-11 are cross-sectional views of a portion of a nonplanar device 200 undergoing the method 300 of forming the gate electrode according to embodiments of the present disclosure. Examples that apply the method 300 to a planar device are described with reference to later figures.

Figure 4:
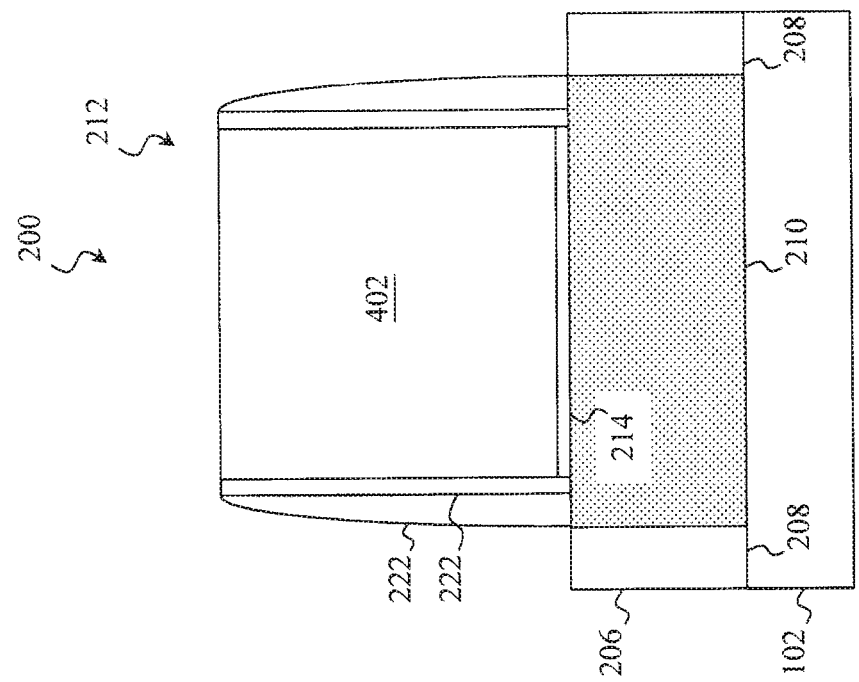

Referring to block 302 of FIG. 3 and to FIG. 4, a substrate 102 is received that includes a semiconductor device 200. The substrate 102 and the semiconductor device 200 may each be substantially similar to those of FIGS. 2A-2C, and in the interest of brevity, similar elements thereof are not described again. In the embodiment of FIG. 4, the semiconductor device 200 includes a portion of a gate structure 212 substantially similar to that of FIG. 2A. The gate structure includes a sacrificial gate electrode 402, which may include polysilicon, a dielectric, a masking material, and/or other suitable materials. Referring to block 304 of FIG. 3 and to FIG. 5, the sacrificial gate electrode 402 is removed leaving a trench 404 defined by the sidewall spacing layers 222. Due in part to the geometry of the trench 404, forming layers within the trench 404 may prove challenging. For example, the trench 404 may have a high aspect ratio and/or narrow interior cavities where deposition reactants do not circulate well.

A gate dielectric layer 216 of the gate structure 212 may be formed either before or after the sacrificial gate electrode 402 is removed. In the example of block 306 of FIG. 3 and FIG. 6, the gate dielectric layer 216 is formed within the trench 404 after the sacrificial gate electrode 402 is removed. In the illustrated embodiment, the gate dielectric layer 216 is formed on the interfacial layer 214 in the trench 404 and also extends along the vertical surfaces of the sidewall spacing layers 222 such that the portions of the gate dielectric layer 216 on the vertical surfaces extend above the portions of the gate dielectric layer 216 on the interfacial layer 214. This forms a U-shaped structure. In some embodiments, a highly-conformal deposition technique such as CVD or ALD is used to deposit the gate dielectric layer 216 in the U-shaped configuration, although non-conformal deposition techniques may also be used. In these embodiments and others, suitable deposition processes include CVD, high-density plasma CVD (HDP-CVD), ALD, PVD, spin-on deposition, and/or other suitable deposition processes. The gate dielectric layer 216 may be similar in composition to those of FIGS. 1-2C.

A work function layer 406 of the gate structure 212 may also be formed either before or after the sacrificial gate electrode 402 is removed. In the example of block 308 of FIG. 3 and FIG. 6, the work function layer 406 is formed on the gate dielectric layer 216 within the trench 404 after the sacrificial gate electrode 402 is removed. The work function layer 406 may be used to tune the threshold voltage of the resulting semiconductor device and, to that end, may include a material specific to the type of device 200 being formed (e.g., n-type work function material for an n-type device, p-type work function material for a p-type device). Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer 406 may include a plurality of layers and may be deposited by CVD, PVD, and/or other suitable process to any suitable thickness. In the illustrated embodiment, the work function layer 406 extends along the vertical surfaces of the gate dielectric layer 216 to form a U-shaped structure.

Figure 7:
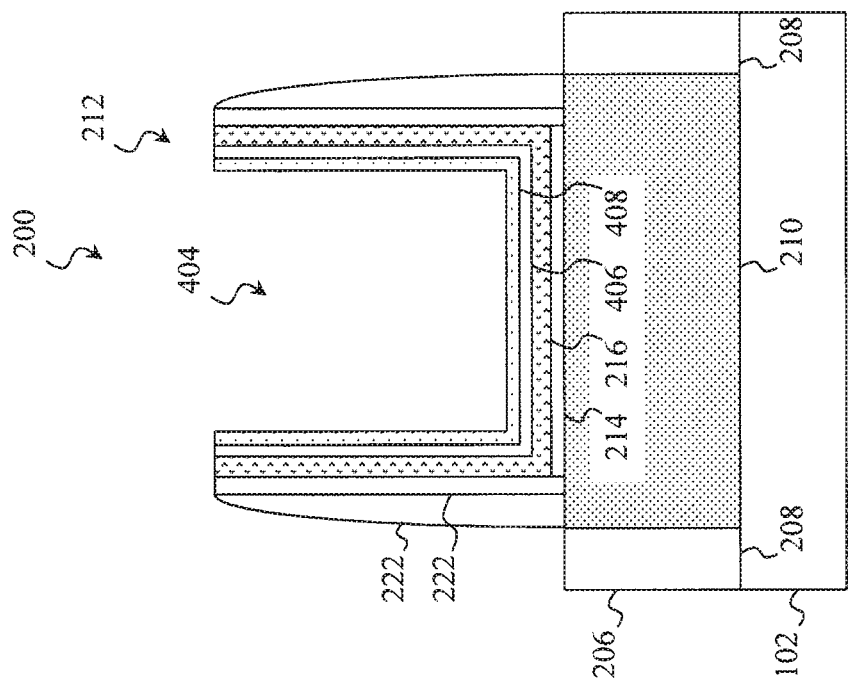
Figure 6:
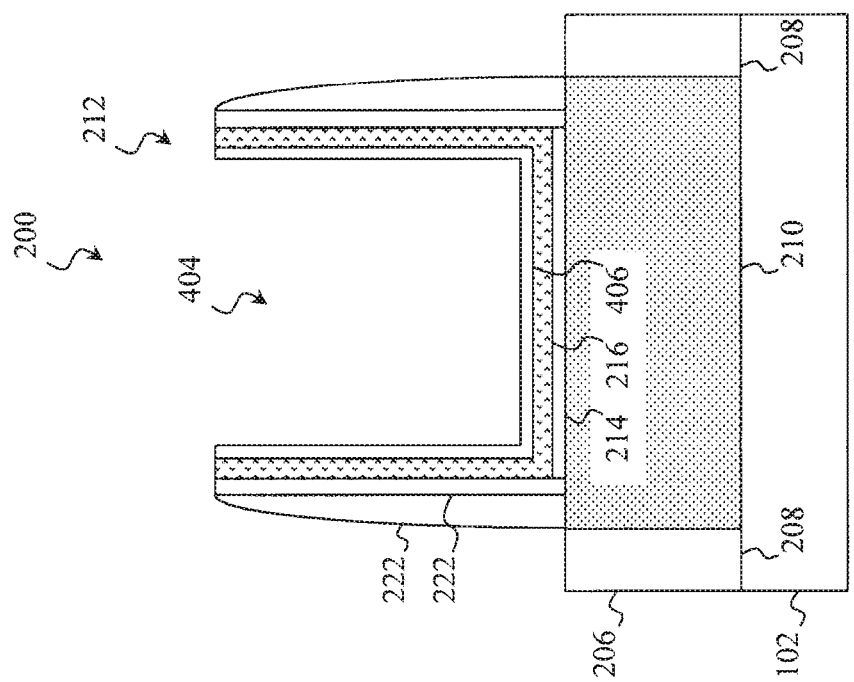

Referring to block 310 of FIG. 3 and to FIG. 7, a wetting layer 408 may be deposited on the gate dielectric layer 216 and/or the work function layer 406. The wetting layer 408 promotes bonding between the layers and may promote uniform deposition of the subsequent layers. In various examples, the wetting layer 408 includes Ti, Ta, Ni, Co, other metals, and/or combinations thereof. The wetting layer 408 may be formed within the trench 404 using any suitable deposition technique including ALD, CVD, and/or sputtering and may be formed to any suitable thickness.

Referring to block 310 of FIG. 3 and to FIG. 8, a barrier layer 410 may be deposited on the wetting layer 408. The barrier layer 410 may be structured to prevent subsequent deposition processes from degrading other layers of the device 200. For example, some metals have a tendency to diffuse into silicon-containing layers during deposition and even after fabrication has completed. Accordingly, the barrier layer 410 may include TiN, TaN, and/or other suitable metals, metal oxides and/or metal nitrides. Similar to the wetting layer 408, the barrier layer 410 may be deposited within the trench 404 using any suitable process including ALD, CVD, and/or sputtering and may be deposited to any suitable thickness. In some embodiments, a single deposition step deposits a metal common to both the wetting layer 408 and the barrier layer 410. The metal of the barrier layer 410 may then undergo an oxidation, nitridation, or other process to form an oxide, nitride, and/or other metal compound in the barrier layer 410.

While a fill material may be deposited directly on the barrier layer 410, it is been determined that as the aspect ratio of the trench 404 becomes larger, even conformal deposition processes tend to deposit material faster near the top of the trench 404. This may result in the topmost portion of the trench 404 closing off while a void still exists in a bottom portion of the trench 404. This tendency to create voids becomes particularly acute as trench aspect ratios approach or exceed 10:1 (depth:width), although it is seen at much lower aspect ratios as well. Accordingly, in some embodiments, a growth control layer 412 is formed on the opposing trench side surfaces 414 but not necessarily the trench bottom 416. This is shown in block 314 of FIG. 3 and FIGS. 9A and 9B. The growth control layer 412 affects the deposition rate of the technique used to subsequently deposit the fill material. In an exemplary embodiment, the growth control layer 412 reduces the deposition rate on the trench side surfaces 414 relative to the rate on the trench bottom 416, so that an otherwise conformal deposition technique fills the bottom of the trench 404 faster than the top. In other words, the growth control layer 412 causes an ALD, CVD, sputtering, and/or other conformal deposition process to fill the trench 404 from the bottom up.

The growth control layer 412 may contain any suitable metal, metal oxide, metal carbide, metal nitride, and/or combination thereof and may be different in composition from the barrier layer 410, for example. In various embodiments, the growth control layer 412 contains WC, WN, AlC, AlN, and/or other suitable materials. In some embodiments, one or more metal constituents of the growth control layer 412 are selected to match metal components of the subsequently deposited fill material 418. In some such embodiments, WC or WN is selected for the growth control layer 412 based on a W-containing fill material 418. In further such embodiments, AlC or AlN is selected for the growth control layer 412 based on an Al-containing fill material 418.

The growth control layer 412 may be deposited to any thickness (measured perpendicular to the side surfaces 414), although for materials with lower conductivity, the growth control layer 412 may be quite thin (e.g., between about 1 Å and about 20 Å at its thickest). The growth control layer 412 extends along at least the upper portions of the side surfaces 414 and may extend all the way to the bottom surface 416 as shown in FIG. 9B. Due to the growth control layer 412, the bottom surface 416 of the trench 404 has a different composition from the trench sidewalls defined by the growth control layer 412. This difference may be used to tune subsequent deposition processes.

Any suitable conformal or non-conformal deposition may be used to form the growth control layer 412. In various embodiments, ALD, CVD, sputtering, and/or other suitable techniques are used to form the growth control layer 412 on the side surfaces 414. In one such embodiment, a metal component of the growth control layer 412 is deposited via ALD and a subsequent plasma treatment is performed using a nitrogen-containing and/or carbon-containing gas to form a metal nitride and/or metal carbide. Even though some of these deposition techniques are conformal in most applications, in such embodiments, the geometry of the trench 404 may prevent the reactants from reaching the bottom of the trench 404. Thus, these techniques may deposit material on the side surfaces 414 faster than the bottom surface 416, which turns the difficulty of filling the trench bottom 416 into an advantage. Deposition may be followed by an anisotropic etching process to remove any deposited material from the bottom surface 416 of the trench 404. For example, in an embodiment, the growth control layer 412 is deposited by sputtering followed by an anisotropic dry etch that targets deposited material on the bottom surface 416.

Figure 11:
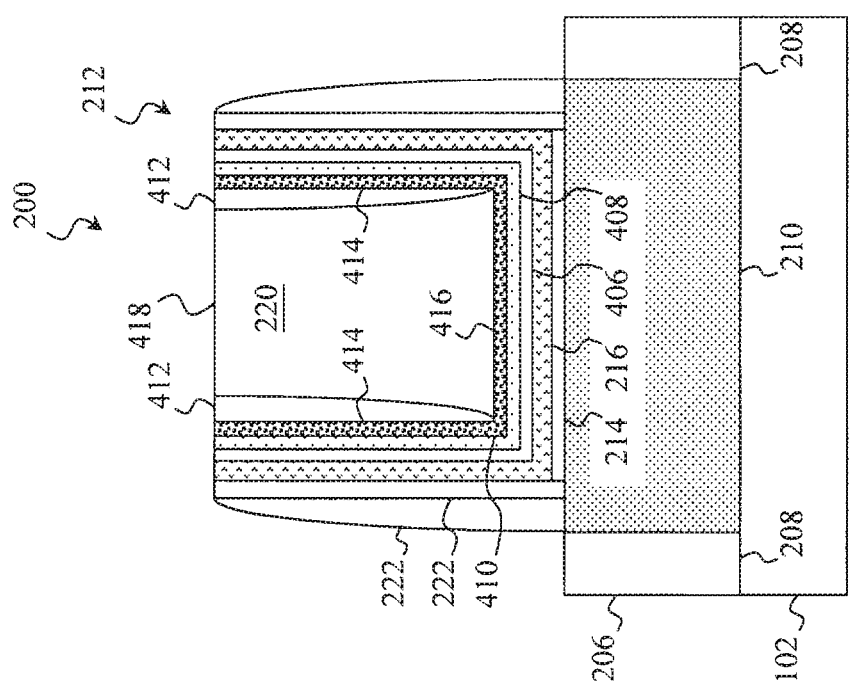
Figure 13:
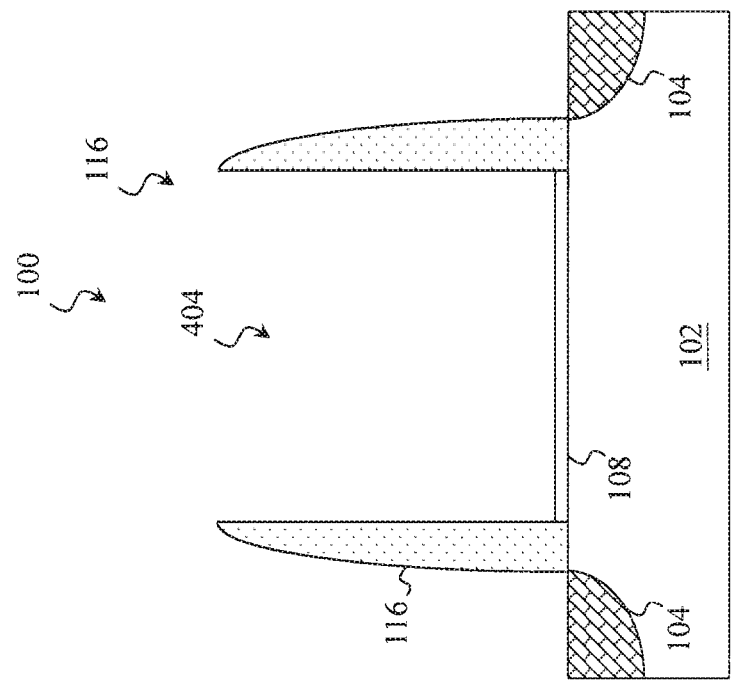
FIGS. 12-19 are cross-sectional views of a portion of a planar device undergoing the method of forming a gate electrode according to embodiments of the present disclosure.

Referring to block 316 of FIG. 3 and to FIGS. 10 and 11, a fill material 418 of the gate electrode 220 may be deposited within the trench 404 on the growth control layer 412. FIG. 10 corresponds to the embodiments of FIG. 9A where the growth control layer 412 does not extend to the bottom surface 416, while FIG. 11 corresponds to the embodiments of FIG. 9B where the growth control layer 412 does extend to the bottom surface 416. The fill material 418 may include any suitable conductor including W, Al, Cu, Ti, Ag, Ru, Mo, other suitable metals and alloys thereof. The fill material 418 may be formed using any suitable technique including ALD, CVD, and/or sputtering. Due in part to the growth control layer 412, the fill material 418 may be deposited on the bottom surface 416 of the trench 404 faster than it is deposited on the side surfaces 414. In a particular application, a metal carbide growth control layer 412 reduces the deposition rate on the side surfaces 414 by a factor of 10. It has been determined through experimentation and analysis that filling high-aspect ratio trenches 404 in this manner greatly reduces the occurrences of voids and other defects in the fill material 418.

Referring to block 318 of FIG. 3, a planarization technique such as chemical mechanical planarization/polishing (CMP) may be performed on the semiconductor device 200 to remove excess materials extending beyond the trench 404. Referring to block 320 of FIG. 3, the device 200 may be provided for further fabrication.

The method 300 may also be used to form a gate electrode in a planar device as described with reference to FIGS. 3 and FIGS. 12-19. FIGS. 12-19 are cross-sectional views of a portion of a nonplanar device 100 undergoing the method 300 of forming a gate electrode according to embodiments of the present disclosure.

Figure 12:
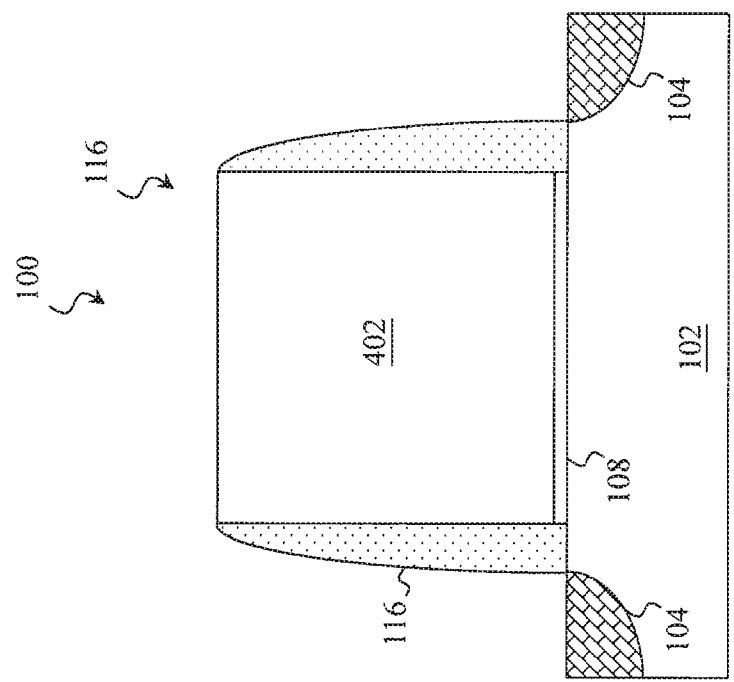

Referring to block 302 of FIG. 3 and to FIG. 12, a substrate 102 is received that includes a semiconductor device 100. The substrate 102 and the semiconductor device 100 may each be substantially similar to those of FIG. 1, and in the interest of brevity, similar elements thereof are not described again. In the embodiment of FIG. 12, the semiconductor device 100 includes a portion of a gate structure 116 substantially similar to that of FIG. 1 that includes a sacrificial gate electrode 402. The sacrificial gate electrode 402 may include polysilicon, a dielectric, a masking material, and/or other suitable materials. Referring to block 304 of FIG. 3 and to FIG. 13, the sacrificial gate electrode 402 is removed leaving a trench 404 defined by the sidewall spacers 116. Due in part to the geometry of the trench 404, forming layers within may prove challenging. For example, the trench 404 may have a high aspect ratio and/or narrow interior cavities where deposition reactants do not circulate as well.

A gate dielectric layer 110 may be formed either before or after the sacrificial gate electrode 402 is removed. Accordingly, in block 306 of FIG. 3 and FIG. 14, the gate dielectric layer 110 is formed within the trench 404 after the sacrificial gate electrode 402 is removed. In the illustrated embodiment, the gate dielectric layer 110 is formed on the interfacial layer 108 in the trench 404 and also extends along the vertical surfaces of the sidewall spacers 116 to form a U-shaped layer. Suitable deposition processes include CVD, high-density plasma CVD (HDP-CVD), ALD, PVD, spin-on deposition, and/or other suitable deposition processes, and the gate dielectric layer 110 may be similar in composition to those of FIGS. 1-2C.

A work function layer 406 may also be formed either before or after the sacrificial gate electrode 402 is removed. In the example of block 308 of FIG. 3 and FIG. 14, the work function layer 406 is formed on the gate dielectric layer 110 within the trench 404 after the sacrificial gate electrode 402 is removed. The work function layer 406 may include a material tuned to the particular type of device 100 being formed and may be similar in composition to the work function layer 406 of FIG. 4. In the illustrated embodiment, the work function layer 406 extends along the vertical surfaces of the gate dielectric layer 110 to form a U-shape. The work function layer 406 may include a plurality of layers and may be deposited by CVD, PVD, and/or other suitable process to any suitable thickness.

Figure 15:
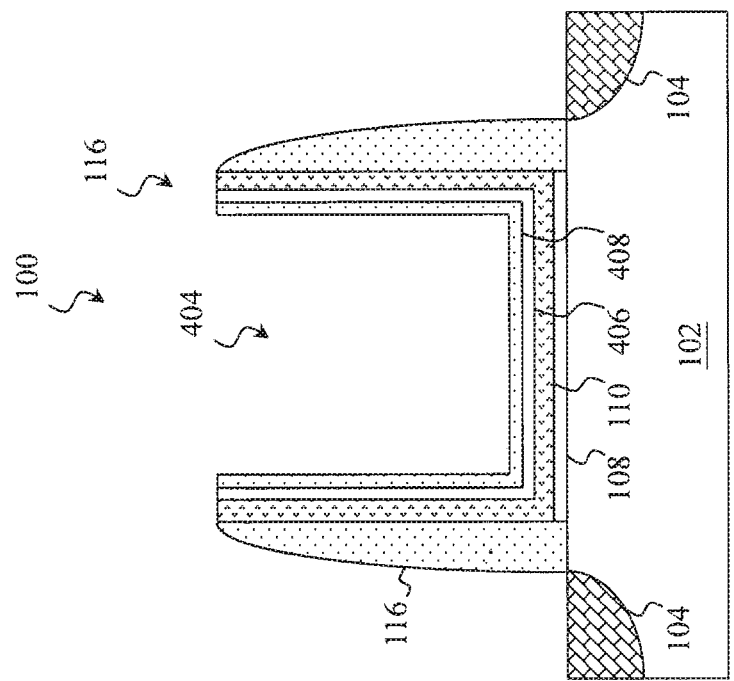
Figure 14:
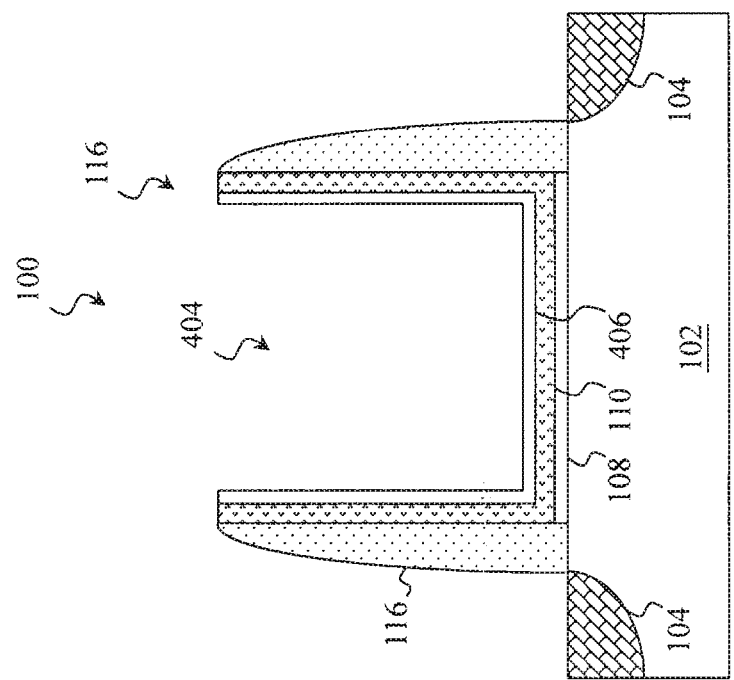

Referring to block 310 of FIG. 3 and to FIG. 15, a wetting layer 408 may be deposited on the gate dielectric layer 110 and/or the work function layer 406. The wetting layer 408 may include Ti, Ta, Ni, Co, other metals, and/or combinations thereof and may be formed by any suitable technique including ALD, CVD, or sputtering. The wetting layer 408 may be formed within the trench 404 using any suitable deposition technique including ALD, CVD, and/or sputtering and may be formed to any suitable thickness.

Figure 16:
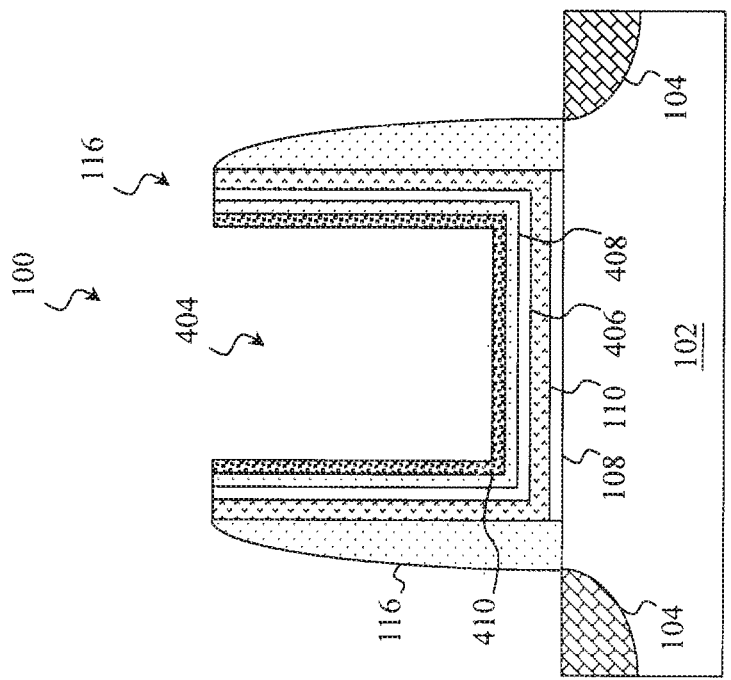

Referring to block 312 of FIG. 3 and to FIG. 16, a barrier layer 410 may be deposited on the wetting layer 408. The barrier layer 410 may include TiN, TaN, and/or other suitable metals, metal oxides and/or metal nitrides and may be deposited by any suitable technique including ALD, CVD, and/or sputtering. In some embodiments, a single deposition step deposits a metal common to both the wetting layer 408 and the barrier layer 410. The metal of the barrier layer 410 may then undergo an oxidation, nitridation, or other process to form an oxide, nitride, and/or other metal compound in the barrier layer 410.

Figure 17A:
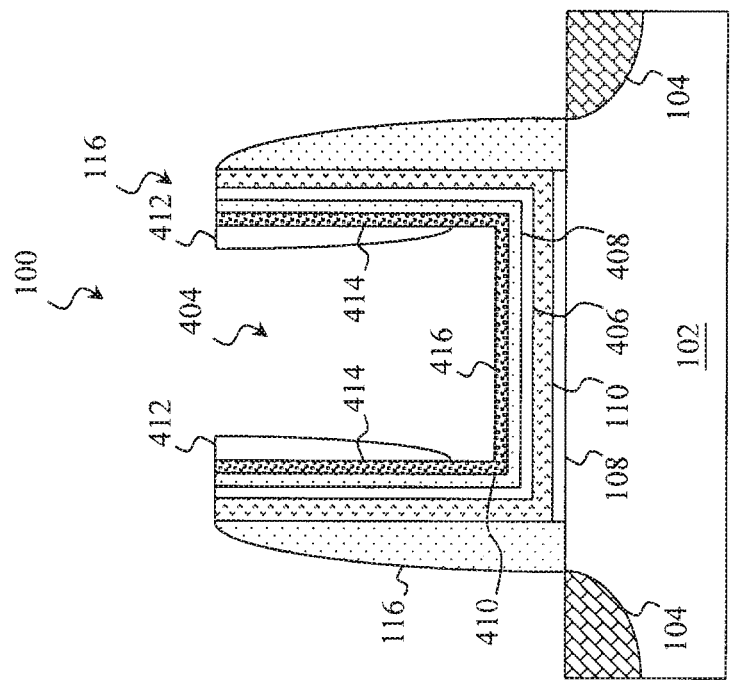
Figure 17B:
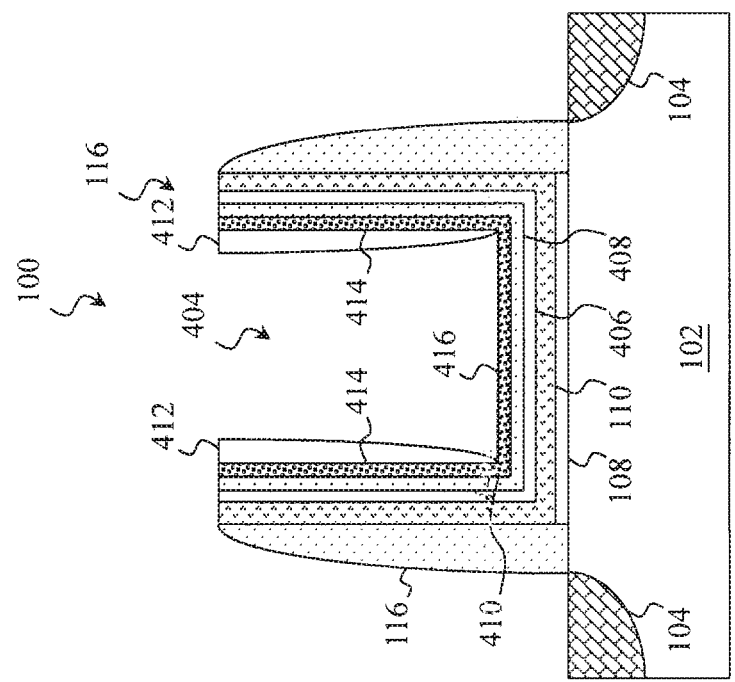

Referring to block 314 of FIG. 3 and FIGS. 17A and 17B, a growth control layer 412 is formed on the trench side surfaces 414 but not necessarily the trench bottom 416. The growth control layer 412 affects the deposition rate of the technique used to subsequently deposit the fill material. Accordingly, the growth control layer 412 may contain any suitable metal, metal oxide, metal carbide, metal nitride, and/or combination thereof. For example, the growth control layer 412 may contain WC, WN, AlC, AlN, and/or other suitable materials. In some embodiments, one or more metal constituents of the growth control layer 412 are selected to match metal components of the subsequently deposited fill material 418.

The growth control layer 412 may be deposited to any thickness (measured perpendicular to the side surfaces 414), and for materials with lower conductivity, the growth control layer 412 may be quite thin (e.g., between about 1 Å and about 20 Å at its thickest). The growth control layer 412 extends along at least the upper portions of the side surfaces 414 and may extend all the way to the bottom surface 416 as shown in FIG. 17B. Due to the growth control layer 412, the bottom surface 416 of the trench 404 has a different composition from the trench sidewalls defined by the growth control layer 412. This difference may be used to tune subsequent deposition processes.

Any suitable conformal or non-conformal deposition may be used to form the growth control layer 412. In various embodiments, ALD, CVD, sputtering, and/or other suitable techniques are used to form the growth control layer 412 on the side surfaces 414. In one such embodiment, a metal component of the growth control layer 412 is deposited via ALD and a subsequent plasma treatment is performed using a nitrogen-containing and/or carbon-containing gas to form a metal nitride and/or metal carbide. In some applications, conformal deposition techniques rely on the geometry of the trench 404 to prevent reactants from reaching the bottom 416 of the trench 404. Deposition may be followed by, an anisotropic etching process to remove any deposited material from the bottom surface 416 of the trench 404. For example, in an embodiment, the growth control layer 412 is deposited by sputtering followed by an anisotropic dry etch that targets deposited material on the bottom surface 416.

Figure 18:
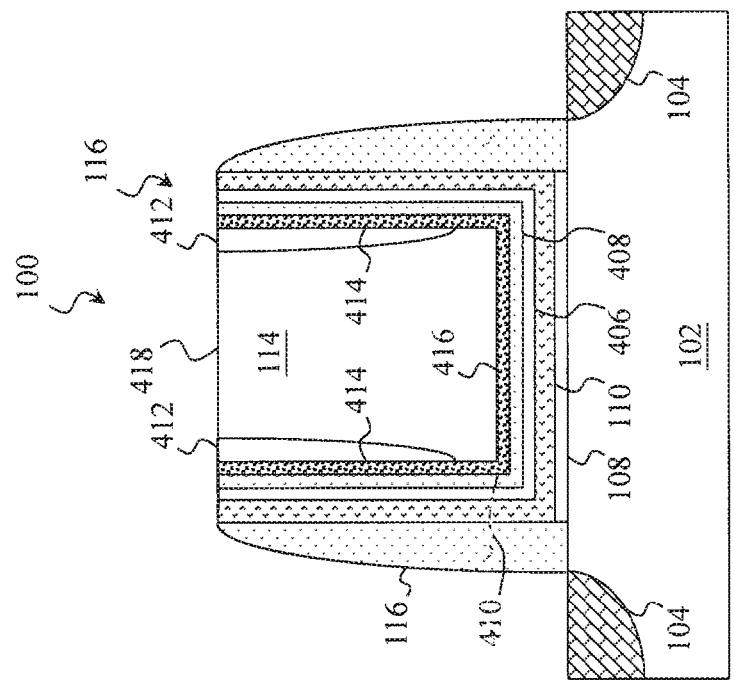
Figure 19:
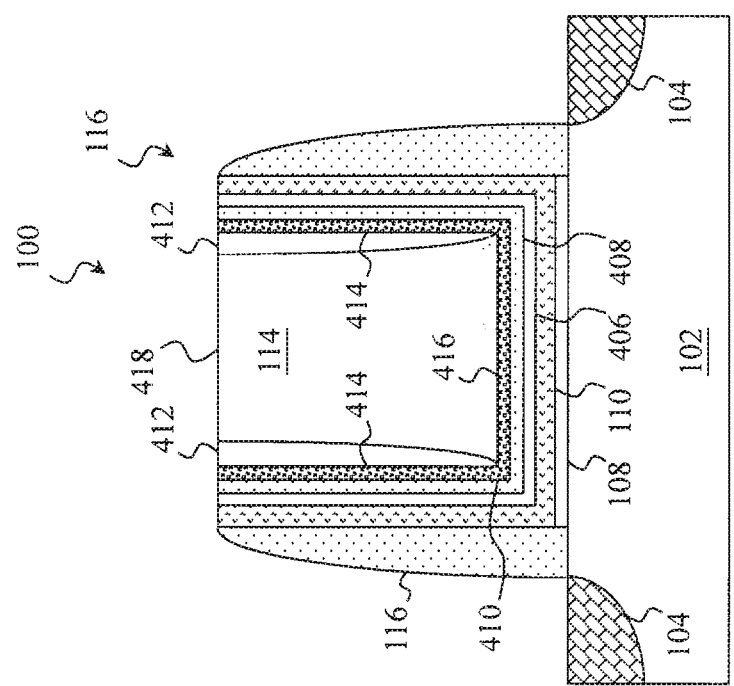

Referring to block 316 of FIG. 3 and to FIGS. 18 and 19, a fill material 418 of the gate electrode 116 may be deposited within the trench 404 on the growth control layer 412. FIG. 18 corresponds to the embodiments of FIG. 17A where the growth control layer 412 does not extend to the bottom surface 416, while FIG. 19 corresponds to the embodiments of FIG. 17B where the growth control layer 412 does extend to the bottom surface 416. The fill material 418 may include any suitable conductor including W, Al, Cu, Ti, Ag, Ru, Mo, other suitable metals and alloys thereof. The fill material 418 may be formed using any suitable technique including ALD, CVD, and/or sputtering. Due in part to the growth control layer 412 the fill material 418 may be deposited on the bottom surface 416 of the trench 404 faster than it is deposited on the side surfaces 414. It has been determined that filling high-aspect ratio trenches 404 in this manner greatly reduces the occurrences of voids and other defects in the fill material 418.

Referring to block 318 of FIG. 3, a planarization technique such as chemical mechanical planarization/polishing (CMP) may be performed on the semiconductor device 100 to remove excess materials extending beyond the trench 404. Referring to block 320 of FIG. 3, the device 100 may be provided for further fabrication.

Figure 20:
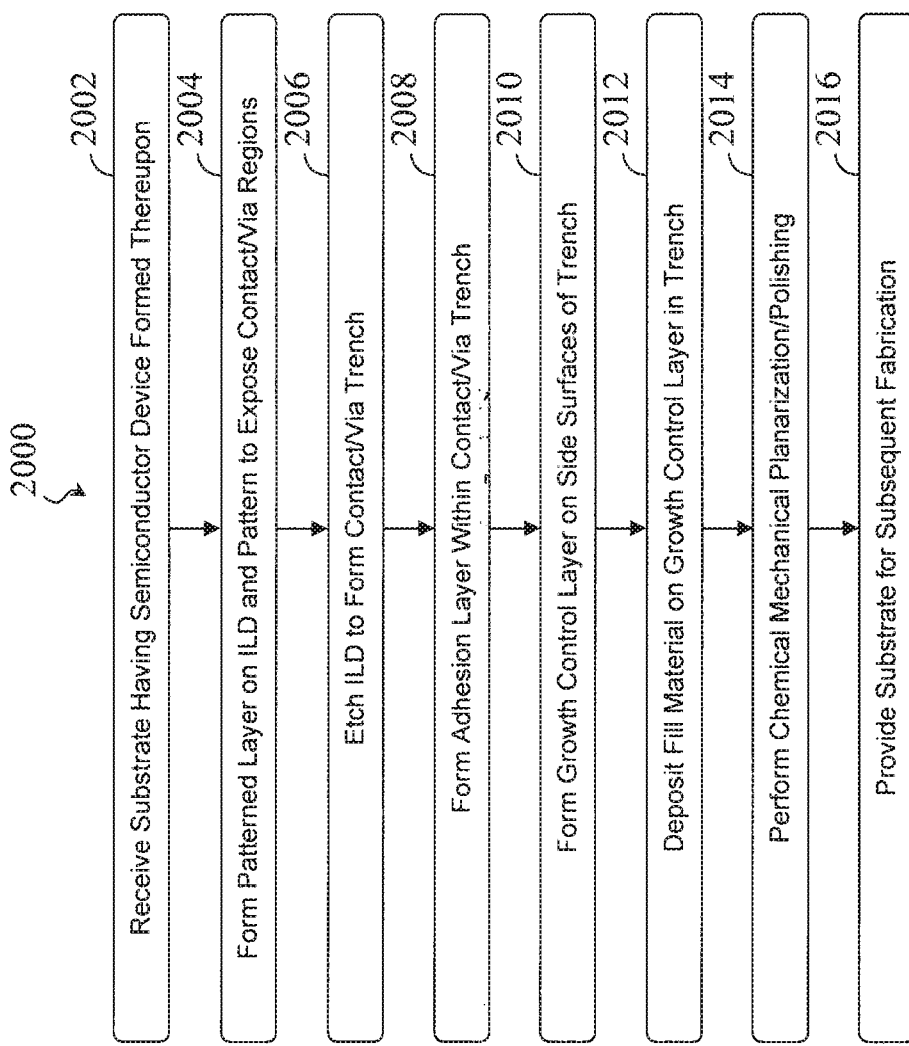
FIG. 20 a flow diagram of a method for forming a contact/via according to embodiments of the present disclosure.
Figures 28A, 28B:
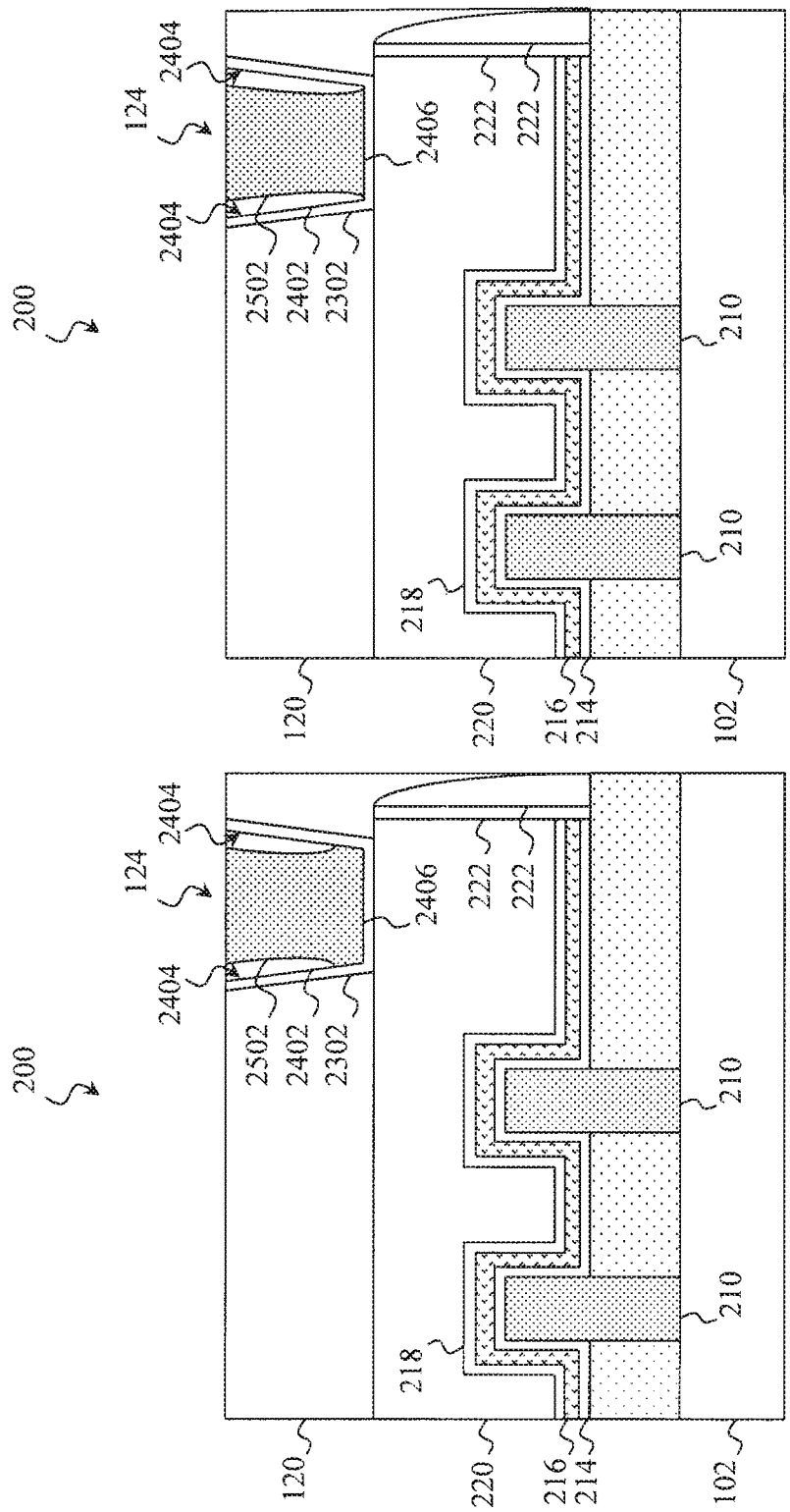
FIGS. 28A and 28B are cross-sectional views of a channel region of a nonplanar device undergoing the method of forming a contact according to embodiments of the present disclosure.
Figure 29A:
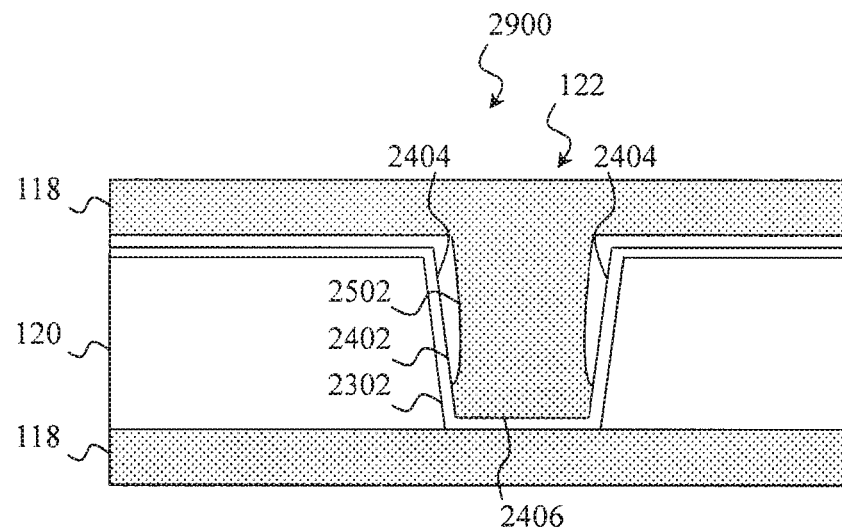
FIGS. 29A and 29B are cross-sectional views of a semiconductor device undergoing the method of forming a via according to embodiments of the present disclosure.
Figure 29B:
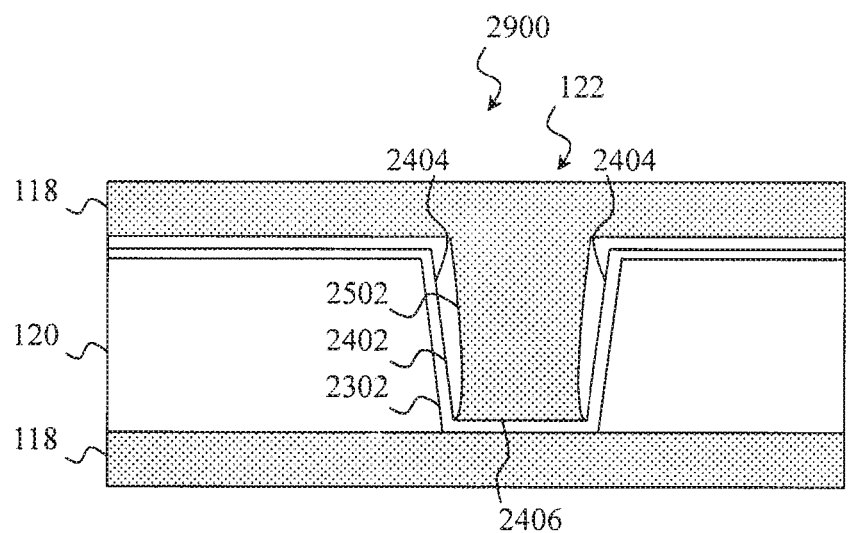

As described above the techniques of the present disclosure may also be used to form contacts and vias. Examples of which are described with reference to FIGS. 20-29B. FIG. 20 is a flow diagram of the method 2000 for forming a contact/via according to embodiments of the present disclosure. It is understood that additional steps can be provided before, during, and after the method 2000 and that some of the steps described can be replaced or eliminated for other embodiments of the method 2000. FIGS. 21-26 are cross-sectional views of a portion of a device 100 undergoing the method 2000 of forming a contact/via according to embodiments of the present disclosure. FIGS. 27A and 27B are cross-sectional views of a source/drain region of a nonplanar device 200 having undergone the method 2000 according to embodiments of the present disclosure. FIGS. 28A and 28B are cross-sectional views of a channel region of a nonplanar device 200 having undergone the method 2000 according to embodiments of the present disclosure. FIGS. 29A and 29B are cross-sectional views of a semiconductor device 2900 having undergone the method according to embodiments of the present disclosure.

Figure 21:
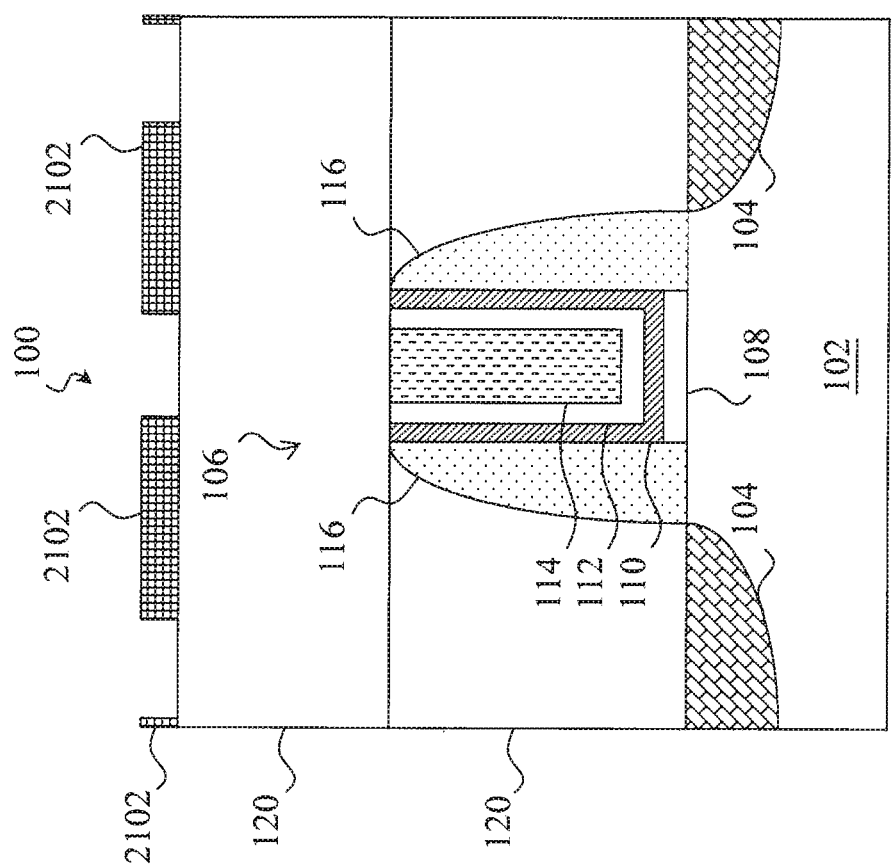
FIGS. 21-26B are cross-sectional views of a portion of a planar device undergoing the method of forming a contact according to embodiments of the present disclosure.

Referring to block 2002 of FIG. 20 and to FIG. 21, a substrate 102 is received that includes a semiconductor device 100. The substrate 102 and the semiconductor device 100 may each be substantially similar to those of FIG. 1, and in the interest of brevity, similar elements thereof are not described again. In the illustrated embodiment, the semiconductor device 100 includes one or more layers of an ILD 120 disposed on the source/drain regions 104 and on the gate structure 116. Referring to block 2004 of FIG. 20 and referring still to FIG. 21, a patterned layer 2102, such as a photoresist layer, is formed on the ILD 120 and patterned to expose contact/via regions. In embodiment of FIG. 21, the exposed contact/via regions, correspond to contact regions. The patterned layer 2102 may be patterned by any direct-write, photolithographic, and/or other suitable process, and in an exemplary embodiment, selected regions of the patterned layer 2102 are exposed to photolithographic radiation causing a photoactive chemical in the patterned layer 2102 to undergo a chemical reaction. A development process is performed that relies on the result of the chemical reaction to selectively remove exposed or unexposed regions of the patterned layer 2102.

Figure 22:
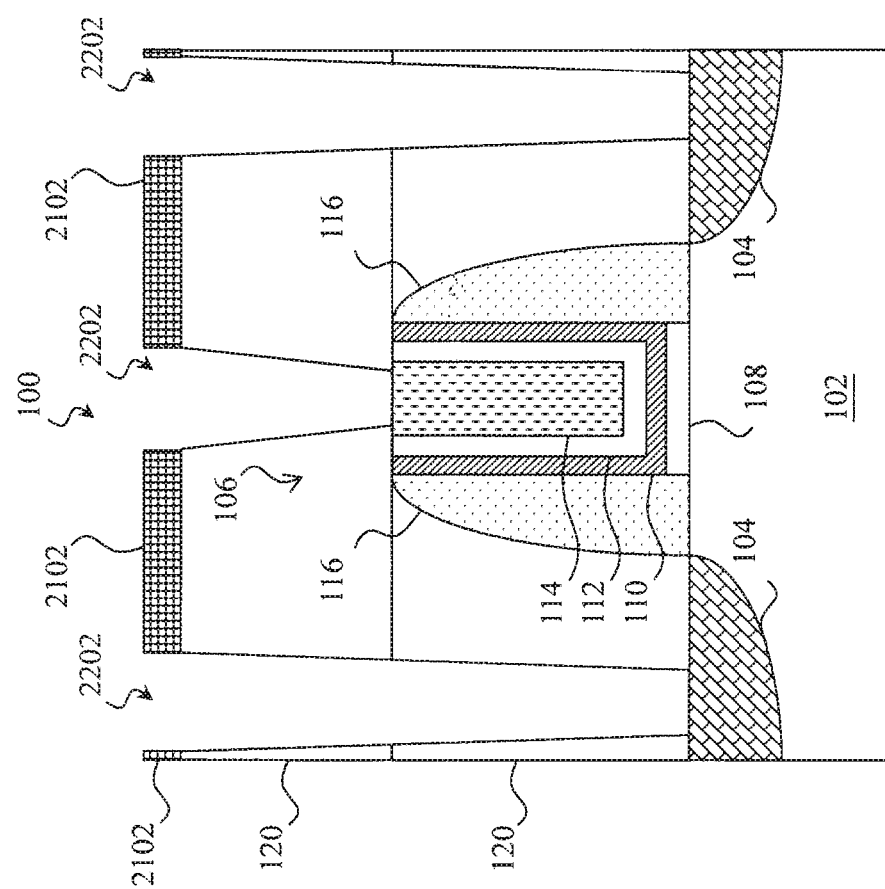

Referring to block 2006 of FIG. 20 and to FIG. 22, the ILD layer(s) 120 are etched using the patterned layer 2102 to selectively etch the contact/via recesses such as the contact recesses 2202 of FIG. 22. The etching of the ILD layer 120 may include any suitable etching technique including wet etching, dry etching, reactive ion etching (RIE), etc., and may use any suitable etch chemistry or combination thereof. In an exemplary embodiment, the etching of block 2006 includes a first etch that utilizes a directional, or anisotropic, etching technique to form a vertical recess and a second etch that utilizes a non-directional, or isotropic, etching technique to widen the recess. The remaining patterned layer 2102 may be removed after the ILD layer(s) 120 are etched.

Figure 23:
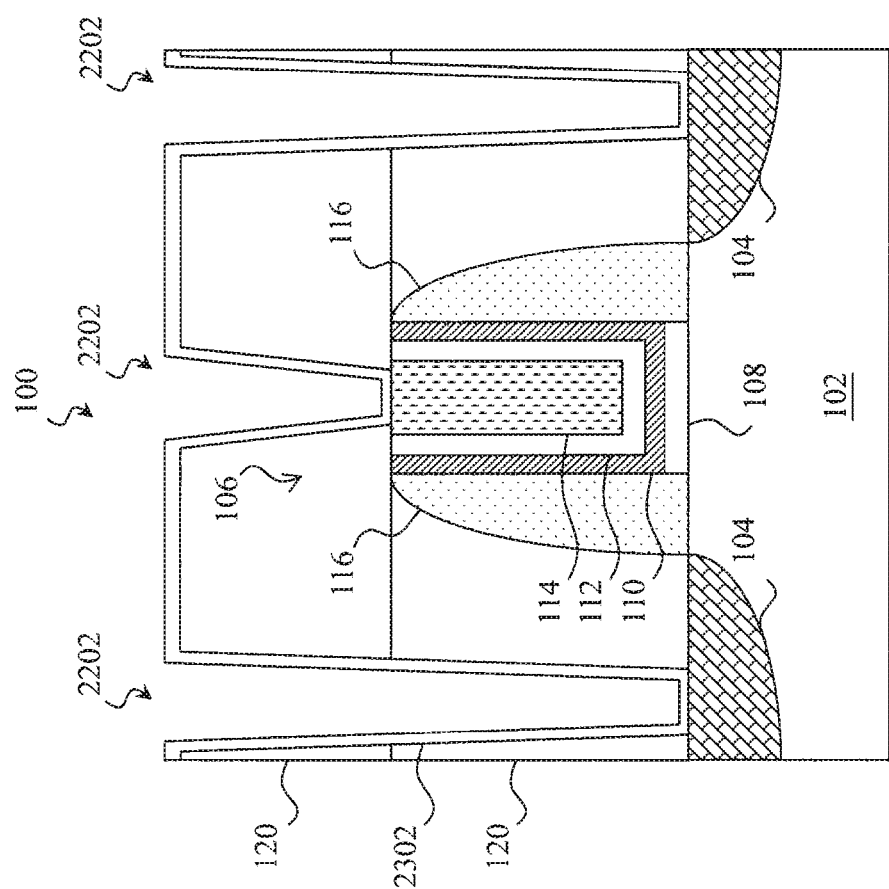

Referring to block 2008 of FIG. 20 and to FIG. 23, an adhesion layer 2302 formed on the ILD and within the etched portions of the patterned layer 2102. As the name implies, the adhesion layer 2302 may be used to improve the quality of the interface between the existing materials, including the ILD layers 120, the source/drain regions 104, and the gate structure 116 and subsequently deposited materials such as a fill material of the contacts/vias. Accordingly, the adhesion layer 2302 may include one or more layers of conductive materials including metals (e.g., Ti, Ta, W, Al, Ni, Cu, Co, etc.) and metal nitrides, which may be deposited via ALD, CVD, PE CVD, PEALD, PVD, and/or other suitable deposition process. In the present embodiment, the adhesion layer 2302 includes multiple deposited layers of Ti and TiN. In other embodiments, one or more additional layers are added, such as barrier layers.

Figure 24B:
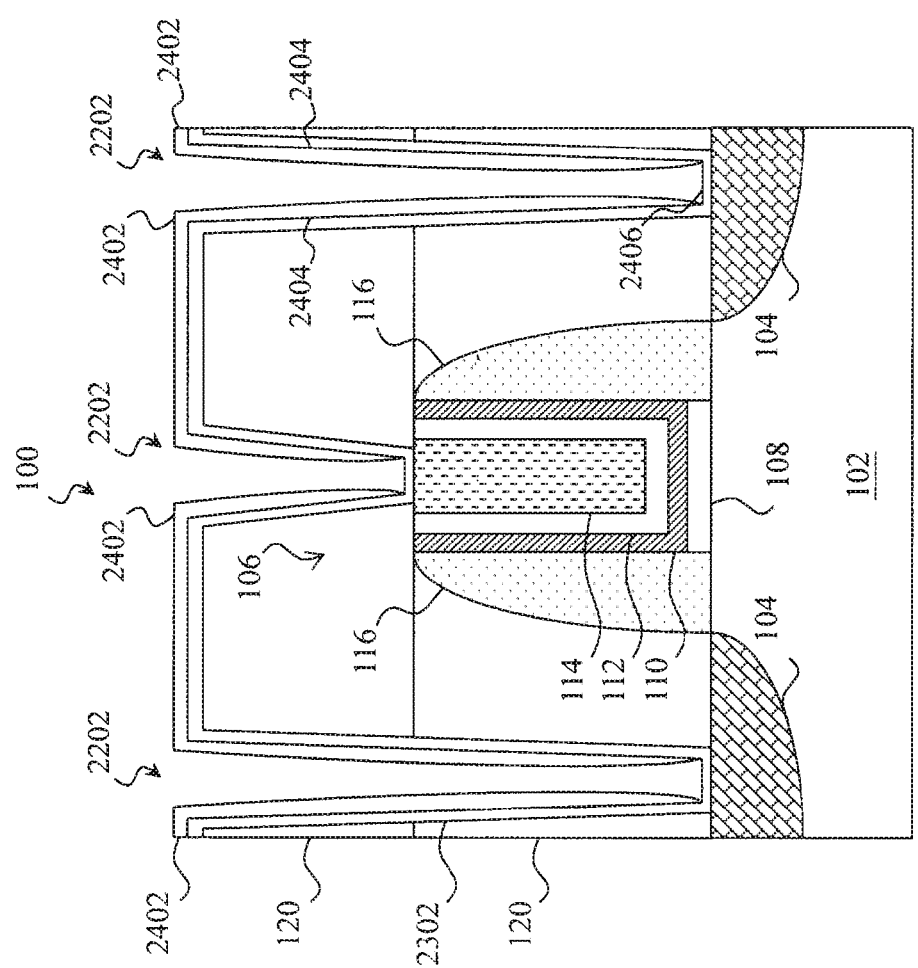

While the contacts 124 may be formed by depositing a fill material directly on the adhesion layer 2302, it is been determined that as the aspect ratio of the contact/via recess becomes larger, voids and discontinuities may occur similar to those described in the context of metal gate fill techniques. Accordingly, referring to block 2010 of FIG. 20 and to FIGS. 24A and 24B, in some embodiments, a growth control layer 2402 is formed on the side surfaces 2404 of the recess but not necessarily the bottom surface 2406. The growth control layer 2402 may cover only topmost a portion of the side surfaces 2404 as shown in FIG. 24A or may extend to the bottom surface 2406 as shown in FIG. 24B. The growth control layer 2402 affects the deposition rate of the technique used to subsequently deposit the fill material and may reduce the deposition rate on the recess side surfaces 2404, so that an otherwise conformal deposition technique fills the bottom of the recess faster than the top.

The growth control layer 2402 may contain any suitable metal, metal oxide, metal carbide, metal nitride, and/or combination thereof and may be different in composition from the adhesion layer 2303, for example. In various embodiments, the growth control layer 2402 contains WC, WN, AlC, AlN, and/or other suitable materials. In some embodiments, one or more metal constituents of the growth control layer 2402 are selected to match metal components of the subsequently deposited fill material. In some such embodiments, WC or WN is selected for the growth control layer 2402 based on a W-containing fill material. In further such embodiments, AlC or AlN is selected for the growth control layer 2402 based on an Al-containing fill material.

The growth control layer 2402 may be deposited to any thickness (measured perpendicular to the side surfaces 2404), although for materials with lower conductivity, the growth control layer 2402 may be quite thin (e.g., between about 1 Å and about 20 Å at its thickest). As a result of the growth control layer 2402, the bottom surface 2406 of the recess has a different composition from at the recess sidewalls defined by the growth control layer 2402. This difference may be used to tune subsequent deposition processes.

Any suitable conformal or non-conformal deposition may be used to form the growth control layer 2402. In various embodiments, ALD, CVD, sputtering, and/or other suitable techniques are used to form the growth control layer 2402 on the side surfaces 2404. In one such embodiment, a metal component of the growth control layer 2402 is deposited via ALD and a subsequent plasma treatment is performed using a nitrogen-containing and/or carbon-containing gas to form a metal nitride and/or metal carbide. Deposition may be followed by an anisotropic etching process to remove any deposited material from the bottom surface 2406 of the recess 2202. For example, in an embodiment, the growth control layer 2402 is deposited by sputtering followed by an anisotropic dry etch that targets deposited material on the bottom surface 2406.

Figure 25:
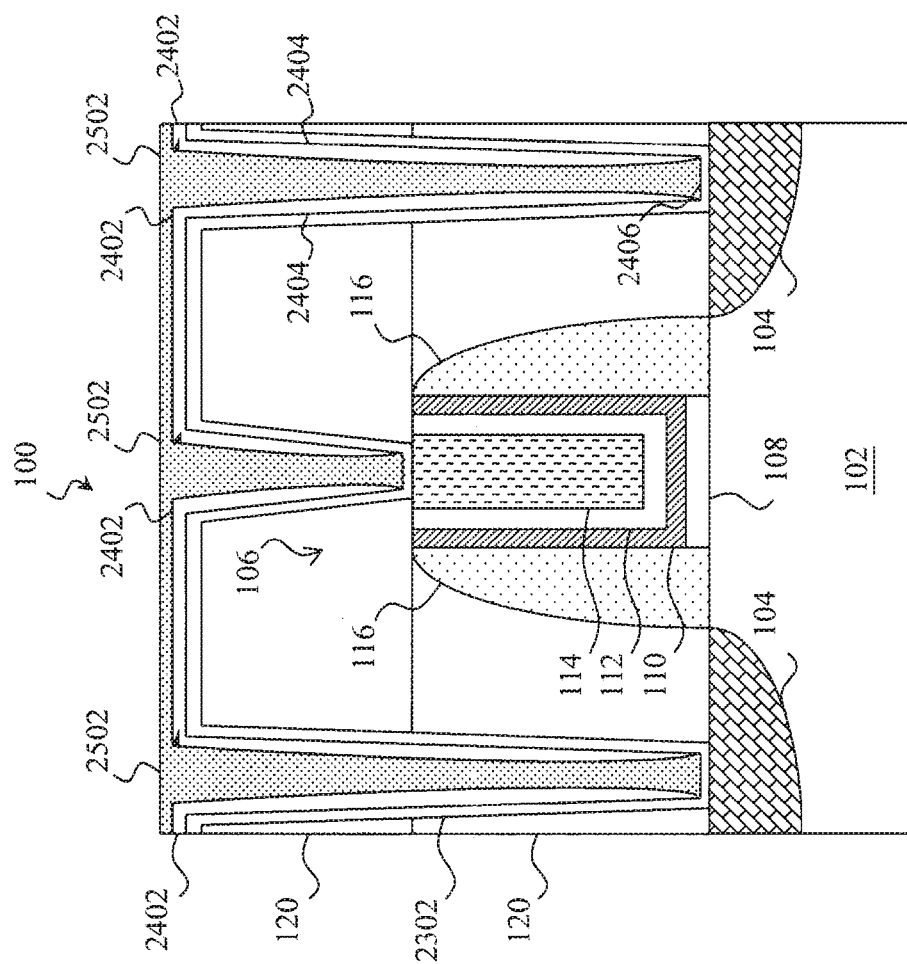

Referring to block 2012 of FIG. 20 and to FIG. 25, a fill material 2502 of the contact/via may be deposited within the recess on the growth control layer 2402. The fill material 2502 may include any suitable conductor including metals (e.g., W, Al, Ta, Ti, Ni, Cu, etc.), metal oxides, metal nitrides, and/or combinations thereof. The contact fill material 307 may be deposited by any suitable technique including PVD (e.g., sputtering), CVD, PE CVD, ALD, PEALD, and/or combinations thereof. Due in part to the growth control layer 2402 the fill material 2502 may be deposited on the bottom surface 2406 of the recess 2202 faster than it is deposited on the side surfaces 2404. It has been determined through experimentation and analysis that filling high-aspect ratio recesses in this manner greatly reduces the occurrences of voids and other defects in the fill material 2502.

Figure 26A:
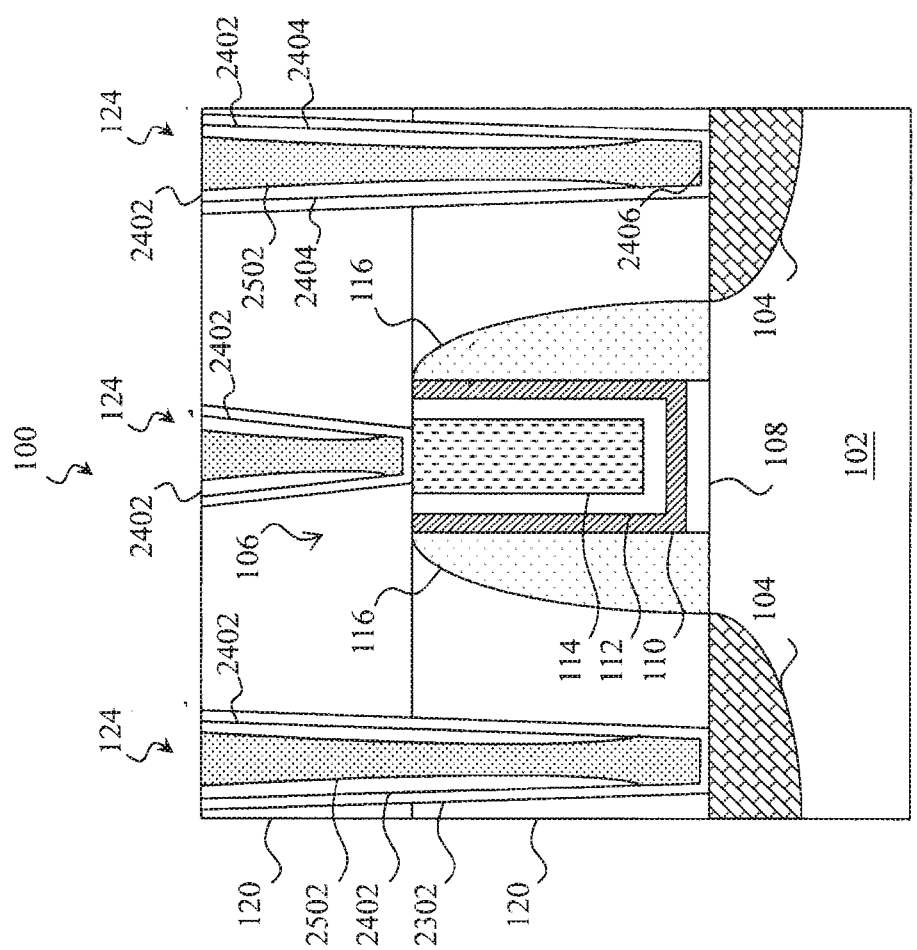
Figure 26B:
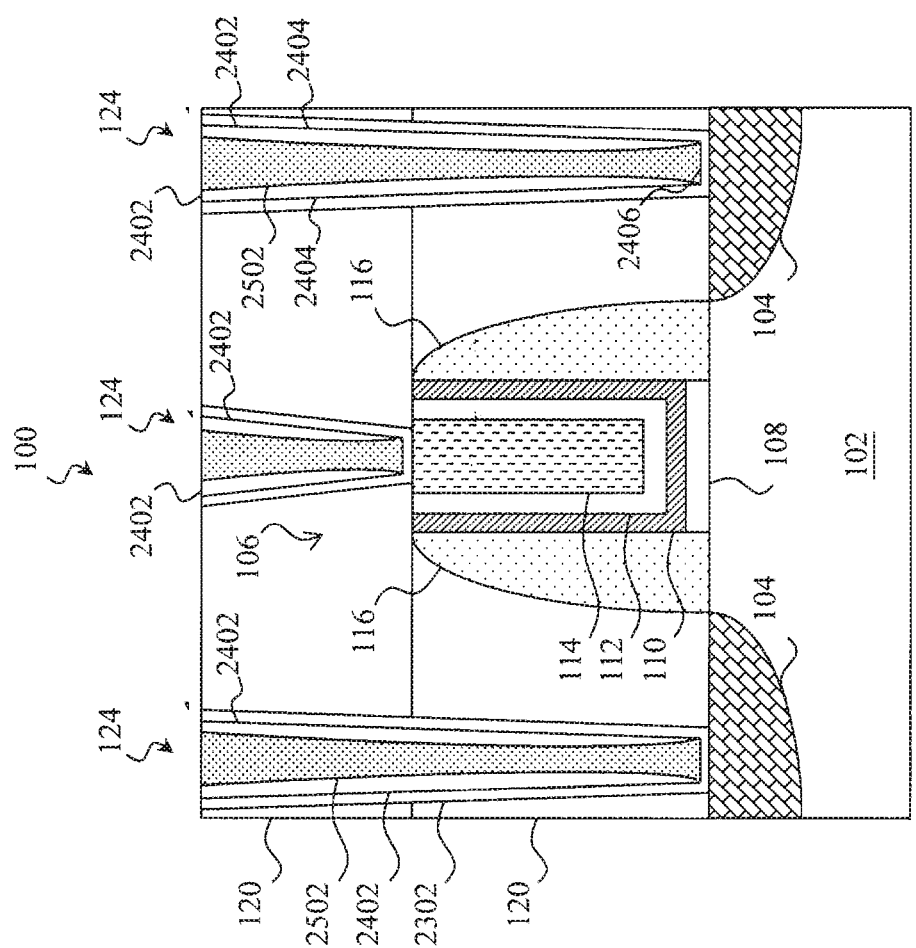

Referring to block 2014 of FIG. 20 and to FIGS. 26A and 26B, a planarization technique such as chemical mechanical planarization/polishing (CMP) may be performed on the semiconductor device 100 to remove excess materials extending beyond the recesses. FIG. 26A corresponds to the embodiments of FIG. 24A where the growth control layer 2402 does not extend to the bottom surface 2406, while FIG. 26B corresponds to the embodiments of FIG. 24B where the growth control layer 2402 does extend to the bottom surface 2406. Referring to block 2016 of FIG. 20, the device 100 may be provided for further fabrication.

Other examples of contacts and vias that may be formed by the method 2000 are shown in FIGS. 27A-29B. Referring first to FIGS. 27A and 27B, exemplary contacts 124 to source/drain regions 208 of a nonplanar device 200 formed by the present techniques are disclosed. In many aspects, the nonplanar device 200 is substantially similar to that of FIGS. 2A-2C, and in the interest of brevity, similar structures may not be repeated.

In the illustrated embodiment, the contacts 124 extend into the ILD 120 in the vertical direction and span one or more source/drain regions 208 in the horizontal direction. Accordingly, an adhesion layer 2302 of the contacts 124, substantially similar to that of FIG. 23, is disposed on at least one surface of at least one source/drain region 208 using a technique such as that of block 2008 of FIG. 20. The adhesion layer 2302 may also be disposed on the substrate 102 between the source/drain regions 208.

The contact 124 further includes a growth control layer 2402 formed by a process such as that of block 2010 of FIG. 20. The growth control layer 2402 is disposed on the side surfaces 2404 of the trench, but not necessarily on the substrate 102 at the bottom surface 2406. Depending on the application, the growth control layer 2402 may be disposed on the source/drain regions 208 as shown in FIG. 27A or may be omitted in these regions as shown in FIG. 27B. A fill material 2502, such as the fill material 2502 of FIG. 25 is disposed on the growth control layer 2402 to complete the contact 124.

Referring to FIGS. 28A and 28B, exemplary contacts 124 to a gate structure 212 of a nonplanar device 200 formed by the present techniques are disclosed. In many aspects, the nonplanar device 200 is substantially similar to that of FIGS. 2A-2C, and in the interest of brevity, similar structures may not be repeated. The contacts 124 include an adhesion layer 2302 substantially similar to that of FIG. 23. The adhesion layer 2302 is disposed within a recess formed in the ILD 120 over the gate structure 212 using a technique such as that of block 2008 of FIG. 20.

The contact 124 also includes a growth control layer 2402 formed by a process such as that of block 2010 of FIG. 20. The growth control layer 2402 is disposed on the side surfaces 2404 of the trench, but not necessarily on the trench bottom so that the different composition of resulting sidewalls can be used to tune subsequent deposition processes. Depending on the application, the growth control layer 2402 extends along at least the upper portions of the side surfaces 2404 as shown in FIG. 28A and may extend all the way to bottom surfaces (e.g., the adhesion layer 2302 on the gate structure 212) as shown in FIG. 28B. A fill material 2502, such as the fill material 2502 of FIG. 25 is disposed on the growth control layer 2402 to complete the contact 124.

Finally, referring to FIGS. 29A and 29B, the method 2000 may be used to form vias 122. FIGS. 29A and 29B are cross-sectional diagrams of an interconnect structure of a semiconductor device 2900 such as a planar or non-planar semiconductor device according to embodiments of the present disclosure. Similar to the contacts 124, the vias 122 may include an adhesion layer 2302 substantially similar to that of FIG. 23. The adhesion layer 2302 is disposed within a recess formed in the ILD 120 using a technique such as that of block 2008 of FIG. 20. The adhesion layer 2302 may contact an underlying conductive trace 118.

The vias 122 include a growth control layer 2402 formed by a process such as that of block 2010 of FIG. 20. The growth control layer 2402 is disposed on the side surfaces 2404 of the recess, but not necessarily on bottom surface 2406 so that the different composition of the resulting sidewalls can be used to tune subsequent deposition processes. Depending on the application, the growth control layer 2402 extends along at least the upper portions of the side surfaces 2404 as shown in FIG. 29A and may extend all the way to the adhesion layer 2302 on the gate structure 212 as shown in FIG. 29B. A fill material 2502, such as the fill material 2502 of FIG. 25 is disposed on the growth control layer 2402 to complete the via 122 and in some embodiments, to form conductive traces 118.

Accordingly, a technique for forming conductive features is provided, and the structures produced by the technique are disclosed. In some embodiments, the method includes receiving a substrate with a gate structure. The gate structure includes a sacrificial portion that is removed to define a trench within the gate structure. The trench has opposing side surfaces and a bottom surface defined thereupon. A material layer is selectively formed on the opposing side surfaces such that the bottom surface is free of the material layer. A fill material of a gate electrode is deposited on the material layer and on the bottom surface within the trench. In some such embodiments, the forming of the material layer includes depositing a metal using atomic layer deposition (ALD) and performing a plasma treatment of the metal using a carbon-containing gas. In some such embodiments, the forming of the material layer includes a deposition process and an etching process configured to remove deposited material from the bottom surface.

In further embodiments, the method includes receiving a substrate having a recess defined by at least two opposing sidewalls and a bottom surface. A growth control material is deposited within the recess and on the at least two opposing sidewalls such that the bottom surface is free of the growth control material. A fill material layer is deposited within the recess such that the fill material is on the growth control material and on the bottom surface. In some such embodiments, the growth control material includes at least one of a metal nitride or a metal carbide. In some such embodiments, the growth control material and the fill material layer include at least one metal in common.

In yet further embodiments, the semiconductor device comprises a substrate having a gate structure formed thereupon. The gate structure includes a gate dielectric layer disposed on the substrate, a growth control material disposed on a side surface of the gate structure, and a gate electrode fill material disposed on the growth control material and on a bottom surface that is free of the growth control material. In some embodiments, the gate structure further includes a barrier layer disposed between the growth control material and the gate dielectric layer and between the gate electrode fill material and the gate dielectric layer. In some of these embodiments, the barrier layer is different in composition from the growth control material. In some embodiments, the gate electrode fill material contacts a first surface and a second surface that are different in composition.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A device comprising:
a fin structure disposed on a substrate;
a gate structure disposed over the fin structure, wherein the gate structure includes:
a gate dielectric layer disposed over the fin structure;
a first layer disposed over the gate dielectric layer, the first layer having a first sidewall and a second opposing sidewall such that a bottom surface of the first layer extends from the first sidewall to the second sidewall of the first layer;
a growth control material disposed along and physically contacting the first sidewall of the first layer, the growth control material having a different material composition than the first layer, the growth control material having the same material composition throughout the growth control material; and
a gate electrode fill material disposed on and physically contacting the growth control material and physically contacting the bottom surface of the first layer, the gate electrode fill material having a different material composition than the growth control material.

2. The device of claim 1, wherein the first layer includes a material selected from the group consisting of a metal oxide and a metal nitride.

3. The device of claim 1, wherein the gate electrode fill material is disposed between the growth control material and the bottom surface of the first layer such that no portion of the growth control material interfaces with the bottom surface of the first layer.

4. The device of claim 1, wherein the growth control material extends to and physically contacts the bottom surface of the first layer.

5. The device of claim 1, wherein the gate structure further includes a work function layer disposed on the gate dielectric layer such that the work function layer is disposed between the gate dielectric layer and the first layer.

6. The device of claim 5, wherein the gate structure further includes a wetting layer disposed on the work function layer such that the wetting layer is disposed between the work function layer and the first layer.

7. The device of claim 1, wherein the growth control material includes a material selected from the group consisting of WC, WN, AlC, and AlN.

8. A device comprising:
a gate structure disposed over a substrate, wherein the gate structure includes:
a first material layer having a first u-shaped profile defining a recess, the first material layer having a bottom surface;
a growth control material disposed within the recess, the growth control material decreasing in thickness as the growth control material extends towards the substrate, the growth control material having a different material composition than the first material layer, the growth control material having the same material composition throughout the growth control material; and
a fill material disposed within the recess and physically contacting the growth control material and the bottom surface of the first material layer, the fill material having a different material composition than the growth control material.

9. The device of claim 8, wherein the gate structure further includes:
a gate dielectric layer having a second u-shaped profile;
a work function layer having a third u-shaped profile;
a wetting layer having a fourth u-shaped profile, and wherein the first material layer is barrier layer.

10. The device of claim 9, wherein the gate dielectric layer, the work function layer, the wetting layer, and the barrier layer are formed of different materials.

11. The device of claim 8, wherein the growth control material extends to and physically contacts the bottom surface of the first material layer.

12. The device of claim 8, wherein the growth control material does not physically contact the bottom surface of the first material layer.

13. The device of claim 8, wherein the first material layer, the growth control material and the fill material extend to the same height over the substrate.

14. The device of claim 8, wherein the first material layer includes an oxide material.

15. A device comprising:
a gate structure disposed over a semiconductor substrate, wherein the gate structure includes:
a gate dielectric layer disposed over the semiconductor substrate;
a barrier layer disposed over the gate dielectric layer, the barrier layer having a first sidewall and a second opposing sidewall such that a bottom surface of the barrier layer extends from the first sidewall to the second sidewall of the barrier layer;
a growth control material disposed along and physically contacting the first sidewall of the barrier layer, the growth control material having a different material composition than the barrier layer, the growth control material having the same material composition throughout the growth control material; and
a gate electrode fill material disposed on the growth control material and disposed directly on a first portion of the bottom surface of the barrier layer, the gate electrode fill material having a different material composition than the growth control material.

16. The device of claim 15, wherein the growth control material is disposed directly on a second portion of the bottom surface of the barrier layer.

17. The device of claim 15, wherein the gate electrode fill material has a first width along an upper portion of the gate structure and a second width along a lower portion of the gate structure, the first width being different than the second width.

18. The device of claim 15, wherein the gate structure further includes:
a work function metal layer disposed directly on the gate dielectric layer; and
a wetting layer disposed directly on the work function metal layer.

19. The device of claim 18, wherein the barrier layer is disposed directly on the wetting layer.

20. The device of claim 15, wherein the width of the growth control material decreases as the growth control material extends along the first sidewall of the barrier layer toward the bottom surface of the barrier layer.

* * * * *